(12) United States Patent
Kim

(10) Patent No.: US 8,472,269 B2
(45) Date of Patent: Jun. 25, 2013

(54) REDUNDANCY CONTROL CIRCUIT AND MEMORY DEVICE INCLUDING THE SAME

(75) Inventor: Byung-Chul Kim, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 120 days.

(21) Appl. No.: 13/222,070

(22) Filed: Aug. 31, 2011

(65) Prior Publication Data

US 2012/0051165 A1  Mar. 1, 2012

(30) Foreign Application Priority Data

Sep. 1, 2010  (KR) .................. 10-2010-0085305

(51) Int. Cl.
*G11C 7/00* (2006.01)
*G11C 7/06* (2006.01)
*G11C 17/18* (2006.01)

(52) U.S. Cl.
USPC .................... 365/200; 365/189.07; 365/225.7

(58) Field of Classification Search
USPC ........................................ 365/200
See application file for complete search history.

(56) References Cited

U.S. PATENT DOCUMENTS 6,668,345 B1 * 12/2003 Ooishi et al. .................. 714/710
6,819,605 B2 * 11/2004 Kato .............................. 365/200

FOREIGN PATENT DOCUMENTS

| KR | 0119888 | 11/1995 |
| KR | 10-2003-0042161 A | 5/2003 |
| KR | 10-2006-0001775 A | 1/2006 |
| KR | 10-2006-0002502 A | 1/2006 |

* cited by examiner

*Primary Examiner* — Son Mai
(74) *Attorney, Agent, or Firm* — Muir Patent Consulting, PLLC

(57) ABSTRACT

A redundancy control circuit includes an address fuse circuit and a first circuit. The address fuse circuit includes a plurality of first fuses. Each of the first fuses is configured to be cut based on a result of comparing a number of bits of a defective input address having a first logic level with a number of bits of the defective input address having a second logic level. The address fuse circuit is configured to generate a first address using the first fuses based on a cutting operation that depends on the result of comparing. The first circuit is configured to output either the first address or a second address that is an inverted address of the first address as a repair address, wherein a logic level of each of bits of the repair address is the same as that of the defective input address.

20 Claims, 15 Drawing Sheets

REDUNDANCY CONTROL CIRCUIT AND MEMORY DEVICE INCLUDING THE SAME

CROSS-REFERENCE TO RELATED APPLICATION(S)

This application claims priority under 35 USC §119 to Korean Patent Application No. 10-2010-0085305, filed on Sep. 1, 2010, in the Korean Intellectual Property Office (KIPO), the contents of which are incorporated herein in their entirety by reference.

BACKGROUND

1. Technical Field

Example embodiments relate to a memory device, and more particularly to a redundancy control circuit for repairing defective memory cells and a memory device including the redundancy control circuit.

2. Description of the Related Art

As the integration degree of a semiconductor memory increases, a capacity of the semiconductor memory is increasing rapidly. Increase of the capacity of the semiconductor memory according to the development of the semiconductor technology represents that the number of memory cells included in a chip increases. As the number of memory cells increases, the number of the defective memory cells may also increase. Since the defective memory cells may cause a critical problem in the semiconductor memory device, redundant memory cells are provided to replace the defective memory cells. The defective memory cells are replaced with the redundant memory cells based on repair addresses stored in fuses. When an address of the defective memory cell is inputted, a normal path is blocked and a redundancy path to the redundant cell is activated according to program state of the fuses.

The fuses are programmed or cut out to store information about the repair address. The number of the programmed fuses may be varied according to bit values of the repair address. As the number of the programmed fuses is increased, the residues remaining around the cut area is increased. Thus, the reliability of a redundancy control circuit including the fuses may be degraded due to the increased residues.

SUMMARY

Some example embodiments provide a redundancy control circuit including fuses for which a normal cutting operation or a reverse cutting operation is performed.

Some example embodiments provide a semiconductor device including the redundancy control circuit.

According to one example embodiment, a redundancy control circuit includes an address fuse circuit and a first circuit. The address fuse circuit includes a plurality of first fuses. Each of the first fuses is configured to be cut based on a result of comparing a number of bits of a defective input address having a first logic level with a number of bits of the defective input address having a second logic level. The address fuse circuit is configured to generate a first address using the first fuses based on a cutting operation that depends on the result of comparing. The first circuit is configured to output either the first address or a second address that is an inverted address of the first address as a repair address, wherein a logic level of each of bits of the repair address is the same as that of the defective input address.

The address fuse circuit may be further configured to cut fuses corresponding to bits having the first logic level when a majority of bits in the defective input address have the second logic level, or cut fuses corresponding to bits having the second logic level when a majority of bits in the defective input address have the first logic level.

The redundancy control circuit may further include a master fuse circuit configured to determine whether to output the first address or the second address as the repair address corresponding to the defective input address.

The master fuse circuit may be configured to generate a first master fuse signal for outputting the first address and a second master fuse signal for outputting the second address.

The first and second master fuse signals and the first address may be generated by using a power-up signal.

The first circuit may include a first transmission gate configured to output the first address as the repair address based on the first master fuse signal, an inverter configured to invert the first address to provide the second address, and a second transmission gate configured to output the second address as the repair address based on the second master fuse signal.

The master fuse circuit may include a plurality of second fuses that store information about whether a normal cutting operation or a reverse cutting operation has been performed. The master fuse circuit may be configured to detect program states of the second fuses to generate the first and second master fuse signals.

The redundancy control circuit may further include a redundancy control signal generating unit that includes an address comparison block configured to compare the repair address with the defective input address, and a redundancy enable signal generating circuit configured to perform logical operations based on the comparison result to generate a redundancy enable signal.

According to another example embodiment, a redundancy control circuit includes an address fuse circuit and a first circuit. The address fuse circuit includes a plurality of first fuses. Each of the first fuses is configured to be cut based a result of comparing a number of bits of a defective input address having a logic level of 0 with a number of bits of the defective input address having a logic level of 1. The address fuse circuit is configured to generate a first address using the first fuses based on a normal cutting operation when the number of bits of the defective input address having a logic level of 0 is greater than the number of bits of the defective input address having a logic level of 1, or to generate a second address using the first fuses based on a reverse cutting operation when the number of bits of the defective input address having a logic level of 1 is greater than the number of bits of the defective input address having a logic level of 0. The first circuit is configured to output either the first address or the second address as a repair address, wherein a logic level of each of bits of the repair address is the same as that of the defective input address.

The normal cutting operation may include cutting fuses so that the output from the first fuses has the same logic level as the defective input address, and the reverse cutting operation may include cutting fuses so that the output from the first fuses has opposite logic levels from the defective input address.

According to further example embodiment, a method manufacturing a semiconductor device is disclosed. The method includes determining one or more defective memory cells of the semiconductor device including a first memory cell having a particular address. For the particular address, cutting a plurality of first fuses in a fuse unit, to create a first address that corresponds to the particular address, wherein cutting the plurality of first fuses includes determining to cut one or more of the first fuses corresponding to bits having a first logic level when a majority of bits in the particular address have a second logic level, or determining to cut one or more of the first fuses corresponding to bits having the second logic level when a majority of bits in the particular address have the first logic level. The method further includes configuring the semiconductor device to determine whether to output the first address or a second address that is an inverted address of the first address as a repair address. The method further includes configuring the semiconductor device to generate the repair address, wherein a logic level of each of bits of the repair address is the same as that of the defective input address.

The first logic level may be 0 and second logic level may be 1.

The step of configuring the semiconductor device to determine whether to output the first address or a second address may include cutting additional fuses that select whether to output the first address or the second address.

BRIEF DESCRIPTION OF THE DRAWINGS

Exemplary embodiments will be more clearly understood from the following detailed description taken in conjunction with the accompanying drawings.

DETAILED DESCRIPTION

Figure 1:
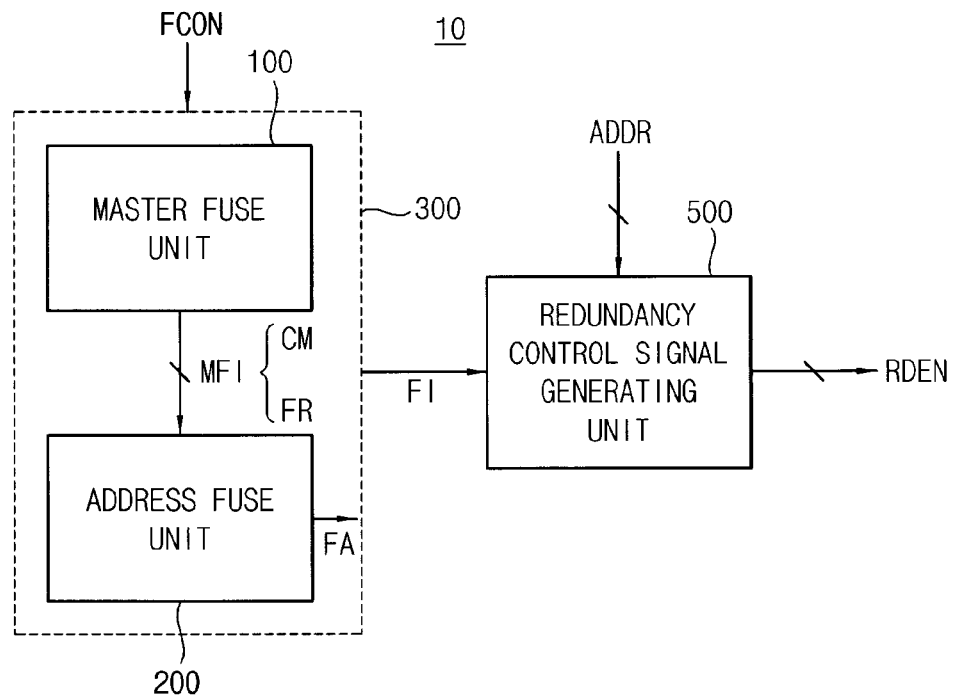
FIG. 1 is a diagram illustrating a redundancy control circuit according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the layout and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a redundancy control circuit according to example embodiments.

Referring to FIG. 1, a redundancy control circuit 10 includes a fuse unit 300 and a redundancy control signal generating unit 500. The fuse unit 300 includes a plurality of fuses that selectively perform a normal cutting operation or a reverse cutting operation based on a repair address signal. The fuse unit 300 detects program states of the plurality of fuses and generates a master fuse signal MFI and a fuse address signal FA based on the detected program states. The plurality of fuses may operate in two modes including a fuse program operation mode and a fuse read-out operation mode.

During the fuse program operation mode, cutting operations are performed on the fuses. The cutting operations may include the normal cutting operation and the reverse cutting operation according to how to store data into the fuses, for example, with inversion or without inversion. As will be described with reference to FIGS. 17 and 18, the fuses perform the cutting operations such as the normal and reverse cutting operations based on a fuse program control signal FCON received from an external device (e.g., test equipment, etc.). That is, the fuse unit 300 performs the cutting operations on the fuses based on the fuse program control signal FCON. The fuse program control signal FCON may include data signals corresponding to the repair address signal. According to example embodiments, the data signal may include inverted bits or original bits of the repair address signal according to the cutting operations. According to certain embodiments, the repair address signal is same as a defective address signal.

In certain systems, when a group of fuses of a set of fuses are cut to program the set of fuses to correspond to a repair address, the fuses that represent the bit "0" are cut, and fuses that represent the bit "1" are not cut. However, fuse cutting can lead to certain problems, as discussed previously. Therefore, in certain embodiments described herein, instead of performing this "normal cutting," a "reverse cutting" procedure is used, where fuses that represent the bit "1" are cut, and fuses that represent the bit "0" are not cut. For example, if certain of the addresses that are defective include more zeroes than ones, then it would require less cutting if the "1" bits were cut, and the "0" bits were not cut. In this situation, the address programmed using the set of fuses is actually an inverse address of the repair address. Therefore, as described further below, when it is determined whether normal cutting or reverse cutting should be used for one or fuse addresses, additional information should be included to indicate whether those particular fuse addresses are inversely programmed.

During the fuse read-out operation mode, the fuse unit 300 may read out fuse information FI including the master fuse signal MFI and the fuse address signal FA corresponding to the repair address signal, by detecting program states of the fuses. The fuse read-out operation mode may include a fuse activation mode and a fuse deactivation mode. During the fuse activation mode, the fuse address signal FA read out from the fuses may be regarded as being valid so that an electronic device including the redundancy control circuit 10 may perform a repair operation based on the fuse address signal FA. During the fuse deactivation mode, the fuse address signal FA read out from the fuses may be regarded as being invalid, and thus the memory device may not perform the repair operation.

In an example embodiment, the fuse unit 300 may include a programming unit that adaptively performs the normal or reverse cutting operation on the plurality of fuses during the fuse program operation mode. The fuse unit 300 may include a fuse sensing unit that detects the program states of the fuses to generate the fuse information FI during the fuse read-out operation mode. The fuse sensing unit will be described with reference to FIGS. 4 and 5. As described above, the fuse information FI may include the master fuse signal MFI and the fuse address signal FA. The master fuse signal MFI includes information based on whether the fuse unit 300 is activated. According to example embodiments, the master fuse signal MFI may further include information based on whether the repair address signal is reversely or normally programmed into the fuses. The fuse unit 300 provides the fuse information FI to the redundancy control signal generating unit 500.

The redundancy control signal generating unit 500 generates a redundancy enable signal RDEN by determining whether an input address signal (e.g., a defective input address) ADDR is the same as the repair address signal based on the master fuse signal MFI and a program state of fuses. The redundancy enable signal RDEN may have an activation level (e.g., a logic high level '1') when the input address signal ADDR is the same as the repair address signal. Otherwise, the redundancy enable signal RDEN may have a deactivation level (e.g., a logic low level '0') when the input address signal ADDR is not the same as the repair address signal. Thus, as used here, the "repair address" refers to the actual address (and not an inverse address) compared an input address signal ADDR. That is, the "repair address" refers to a "defective address". When fuses used to determine a repair address are cut using normal cutting, then an indicator (e.g., part of the master fuse signal MFI) indicates that the bits represented by the fuses (e.g., forming a fuse address) directly represent the repair address. However, when a set of fuses used to determine a repair address are cut using reverse cutting, then an indicator indicates that the bits represented by the fuses inversely represent the repair address. Thus, certain fuse states may be non-inverted to represent a repair address, and other fuse states may be inverted to represent a repair address, based on an indicator that determines whether the fuse states directly or inversely represents the repair address.

As illustrated in FIG. 1, the fuse unit 300 may include a master fuse unit 100 and an address fuse unit 200. The master fuse unit 100 may include at least one first fuse storing a cutting mode signal CM indicating whether the normal cutting operation or the reverse cutting operation has been performed. The master fuse unit 100 may detect program states of the first fuse to reconstruct the cutting mode signal CM and generate a fuse activation signal FR based on the cutting mode signal CM. The address fuse unit 200 may include a plurality of second fuses that are programmed to store an address information signal corresponding to the repair address by selectively performing the normal cutting operation or the reverse cutting operation. The address fuse unit 200 may detect program states of the second fuses to reconstruct the address information signal to generate the fuse address signal FA based on the address information signal and the master fuse signal MFI. Hereinafter, the first fuse and the second fuses will be referred to as master fuse and address fuses, respectively.

The master fuse signal MFI may include a cutting mode signal CM and a fuse activation signal FR. The cutting mode signal CM indicates whether the address fuse unit 200 performs the normal cutting operation or the reverse cutting operation. The fuse activation signal FR indicates whether the fuse unit 300 has to be activated into a fuse activation mode since it stores the valid repair address. That is, the fuse activation signal FR may include information about whether the fuse unit 300 is under a fuse deactivation mode or the fuse activation mode. For example, the fuse activation signal FR may be a one-bit signal as describe with reference to FIG. 3 and may have an activation level when the fuse unit 300 is under the fuse activation mode and the fuse activation signal FR may have a deactivation level when the fuse unit 300 is under the fuse deactivation mode.

The plurality of fuses of the fuse unit 300 may include the at least one master fuse included in the master fuse 100 unit and the address fuses included in the address fuse unit 200. The master fuse may store the cutting mode signal CM and the fuse activation signal FR. The address fuses may store the address information signal that is to be converted or reconstructed into the fuse address signal FA based on the cutting mode signal CM.

As will be described with reference to FIG. 18, during the fuse program operation mode, the address fuse unit 200 may selectively perform the normal cutting operation or the reverse cutting operation according to a number of bits of a first logic level and a second logic level of repair address bits included in the repair address signal. For example, the address fuse unit 200 may perform the normal cutting operation when a number of the repair address bits having the first logic level is greater than a number of the repair address bits having the second logic level. In contrast, the address fuse unit 200 may perform the reverse cutting operation when a number of the repair address bits having the second logic level is greater than a number of the repair address bits having the first logic level. The first and second logic levels may have a logic high level '1' and a logic low level '0', respectively. Alternatively, the first and second logic levels may have the logic low level '0' and the logic high level '1', respectively. When the address fuse unit 200 has performed the reverse cutting operation, an address information signal detected from the reversely programmed address fuses may have an inverted address signal of the repair address.

Where each fuse is configured to be cut out to store the second logic level (e.g. '1'), a group of the address fuses is cut out to reversely store the first logic level (e.g. '0') of the repair address signal, during the reverse cutting operation. Alternatively, a group of the address fuses is cut out to store the second logic level of the repair address signal, during the normal cutting operation.

The redundancy enable signal RDEN may include information on whether the repair operation has to be performed. As described above, the repair operation may substitute redundant portions of the electronic device for respective defective portions corresponding to the repair address signal. The redundancy enable signal RDEN may have various levels according to modes of the repair operation. In an example embodiment, the redundancy enable signal RDEN may be a multiple-bit signal. For example, the number of bits of the redundancy enable signal RDEN may be varied according to the number of defective portions. For convenience of explanation, the redundancy enable signal RDEN is assumed to have one of the activation level (e.g., '1') and the deactivation level (e.g., '0') according to whether the input address signal ADDR is the same as the repair address.

The repair address signal indicates pre-defined access codes for defective portions of the electronic device that include redundant portions for replacing the defective portions. For example, when the electronic device is a semiconductor memory device, the repair address may include memory addresses for accessing defective memory regions (e.g., sets of one or more defective memory cells). In this case, the defective memory regions may be replaced with redundant memory regions, that is, the repair operation may be performed on the defective memory regions to substitute the redundant memory regions for the defective memory regions. When the input address signal ADDR is the same as the repair address signal, the redundancy control circuit 10 activates the redundancy enable signal RDEN into the activation level. The electronic device such as a memory device of FIG. 16 may access the redundant memory regions based on the redundancy enable signal RDEN instead of accessing the defective memory regions.

The repair address signal indicates an address to access a defective portion of an electronic device. The redundancy control circuit 10 may be configured to store a plurality of repair address signals. In an example embodiment, the redundancy control circuit 10 may include a plurality of fuse units 300 that are configured to program information corresponding to respective repair address signals. In another example embodiment, the fuse unit 300 included in the redundancy control circuit 10 may include a master fuse unit 100 and a plurality of address fuse units 200 that are configured to program address information corresponding to respective repair address signals. In these cases, the redundancy enable signal generating unit 500 may generate the redundancy enable signal RDEN by comparing the input address signal ADDR with the fuse address signals FA corresponding to the repair address signals (i.e., determined fuse address signals are the same as the repair address signals), which are sequentially or individually read-out from the fuse unit 300. Hereinafter, for convenience of explanation, configurations for one repair address will be mainly described.

The repair address signal may be stored in the redundancy control circuit 10 using the master and address fuses that perform the cutting operations. The master and address fuses may have various types of fuses, for example, laser fuses, electrical fuses, anti-fuses, etc.

A laser fuse, as one of the widely used fuses, is programmed by cutting the fuse formed with a conductive line, such as a metal line, using laser beam. The laser fuse has an advantage of being simply embodied since an additional circuit to control cutting of the fuse is unnecessary. The laser fuse, however, has disadvantages of limitation to the integration density regardless of the development of the semiconductor memory manufacturing process technology, such as a metal oxide semiconductor (MOS) process, since a predetermined interval between the fuses needs to be secured to prevent damages due to laser fusing. Furthermore the laser fuse may not be reprogrammed after the memory chip including the fuse circuit is packaged. To overcome these disadvantages, an electrical fuse and an anti-fuse programmed by using an electrical signal have been proposed. These fuses have advantages that they are capable of being reprogrammed even after the memory chip is packaged since they may be programmed by the electrical signal. In addition, the size of the fuse circuit may be reduced as the scale of the manufacturing process is reduced. However, in the electrical fuse, residues remain around cut area and thus the resistance of the cut fuse may not increase sufficiently. Such residues form an electrical path having an insufficient resistance. Similarly, in the anti-fuse, electrical short may be incomplete and thus the resistance may not decrease sufficiently. In these cases of incomplete programming, the change of the resistance of programmed area is not sufficient and it is indefinite whether or not the fuse is programmed, thereby degrading the reliability of the fuse circuit.

The number of the programmed fuses may be changed according to bit values of the repair address. As the number of the programmed fuses is increased, the residues remaining around the cut area are increased. Thus, the reliability of a redundancy control circuit including the fuses may be reduced due to the increased residues. The redundancy control circuit 10 according to the example embodiments includes the plurality of fuses that selectively performs the normal cutting operation or the reverse cutting operation such that the number of programmed fuses is relatively reduced, and thus the redundancy control circuit 10 may reduce the disadvantages due to the residues remaining around the cut area.

Figure 2:
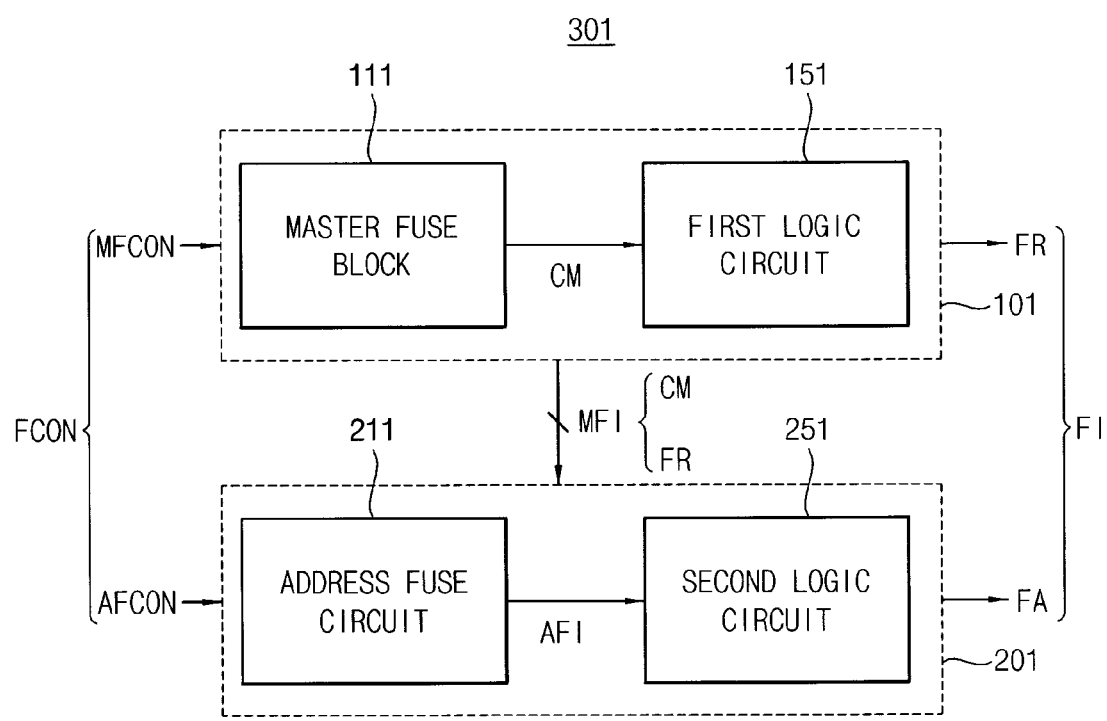
FIG. 2 is a block diagram illustrating an example embodiment of the fuse unit in the redundancy control circuit of FIG. 1.

FIG. 2 is a block diagram illustrating an example embodiment of the fuse unit in the redundancy control circuit of FIG. 1.

Referring to FIG. 2, the fuse unit 301 may include the master fuse unit 101 and the address fuse unit 201. The master fuse unit 101 may include a master fuse block 111 and a first logic circuit 151. The address fuse unit 201 may include an address fuse circuit 211 and a second logic circuit 251.

The master fuse block 111 may include at least one master fuse and may detect program states of the master fuse to generate the cutting mode signal CM. The first logic circuit 151 may generate the fuse activation signal FR based on the cutting mode signal CM. As described above, the master fuse may store information about whether the normal cutting operation or the reverse cutting operation is performed and whether the repair address signal stored in the fuse unit 301 is regarded as being valid (i.e., whether the fuse unit 301 is activated). In an example embodiment, the master fuse block 111 may include two master fuses, one master fuse may store information on whether the normal cutting operation has been performed and the other master fuse may store information on whether the reverse cutting operation has been performed. A logical operation on the two fuses may determine whether the fuse unit is activated. In an alternate embodiment, one master fuse circuit may store information on whether the fuse unit 301 is activated to store the repair address signal, and the other master fuse circuit may store information on whether the normal or reverse cutting operation has been performed. The above case will be described with reference to FIG. 3. In this description, the example embodiments in which the master fuse stores the cutting mode signal CM according to the first case are mainly described.

The address fuse circuit 211 may include address fuses and may detect program states of the address fuses to generate an address information signal AFI. The address fuses may store the address information signal AFI corresponding to the repair address signal by selectively performing the normal cutting operation or the reverse cutting operation. The address fuse unit 201 may generate the fuse address signal FA based on the address information signal AFI and the master fuse signal MFI to output the repair address signal to the redundancy control signal generating unit 500.

As described with reference to FIG. 1, the fuse unit 301 may have the fuse program operation mode and the fuse read-out operation mode. During the fuse program operation mode, the master fuse of the master fuse block 111 is programmed based on a master fuse program control signal MFCON and the address fuses of the address fuse circuit 211 are programmed based on an address fuse program control signal AFCON. In this case, the fuse program control signal FCON may include the master fuse program control signal MFCON and the address fuse program control signal AFCON. That is, the address fuses may have the normal cutting operation or the reverse cutting operation selectively performed based on the master fuse program control signal MFCON and the address fuse program control signal AFCON, respectively. The master fuse program control signal MFCON may be a voltage signal that indicates the cutting mode signal CM or the fuse activation signal FR that are to be stored in the master fuse. The address fuse program control signal AFCON may be a voltage signal that indicates the repair address signal that is to be stored in the address fuses in an inverted form or a not-inverted form.

In example embodiments, the address fuse circuit 211 may selectively perform the normal cutting operation or the reverse cutting operation according to a number of a first logic level and a second logic level of repair address bits included in the repair address signal. The address fuse circuit 211 may perform the normal cutting operation when the number of the repair address bits having the first logic level is larger than the number of the repair address bits having the second logic level. The address fuse circuit 211 may perform the reverse cutting operation when the number of the repair address bits having the second logic level is larger than the number of the repair address bits having the first logic level. When each fuse is configured to be cut for storing '0', the first logic level may be '1' and the second logic level may be '0'. Contrarily, when each fuse is configured to be cut for storing '1', the first logic level may be '0' and the second logic level may be '1'. In this description, for convenience of explanation, it is assumed that each fuse stores a logic level of '1' when each fuse has a cut-out state.

Hereinafter, the fuse program and read-out operations will be described when the cutting mode signal CM indicates that the reverse cutting operation is performed.

For example, when the repair address bits correspond to '0101101011', the number of 1's is greater than the number of 0's. When it is assumed that each fuse stores a logic level of '1' when each fuse is cut out, the address fuse circuit 211 may perform the reverse cutting operation to reduce the number of programmed fuses. For example, the address fuse circuit 211 may cut out address fuses corresponding to 0's of '0101101011'. As the result of the reverse cutting operation, the address fuses store respective bit signals corresponding to '1010010100' and thus the address fuse circuit 211 may generate the address information signal AFI of '1010010100' from the programmed address fuses. The second logic circuit 251 may invert the address information signal AFI of '1010010100' based on the cutting mode signal CM of the master fuse signal MFI, which indicates that the reverse cutting operation is performed. Accordingly, the repair address of '0101101011' may be stored in the address fuse unit 201 with relatively reduced number of programmed fuses, and may be reconstructed base on the address information signal AFI and the cutting mode signal CM.

In an example embodiment, as described with reference to FIG. 2, the fuse unit 301 may output fuse information FI that includes the fuse activation signal FR and the fuse address signal FA. In this case, the fuse unit 301 may detect program states of the address fuses to generate an address information signal AFI, may generate the fuse address signal FA based on the address information signal AFI and the master fuse signal MFI, and may output the fuse address signal FA as the repair address signal to the redundancy control signal generating unit 500. In other example embodiments, the fuse unit 301 may output fuse information FI that includes the master fuse signal MFI and the address information signal AFI. In this case, the redundancy control signal generating unit 500 may generate the redundancy enable signal RDEN depending on whether an input address signal ADDR is the same as the repair address signal based on the master fuse signal MFI and the address information signal AFI. When the cutting mode signal CM indicates that the reverse cutting operation is performed, the redundancy control signal generating unit 500 may perform bit-wise inversion on the address information signal AFI and may compare the inverted address information signal and the input address ADDR to generate the redundancy enable signal RDEN. Contrarily, when the cutting mode signal CM indicates that the normal cutting operation is performed, the redundancy control signal generating unit 500 compare the address information signal AFI and the input address ADDR to generate the redundancy enable signal RDEN.

The master and address fuses of the fuse unit 301 may have various types, for example, laser fuses, electrical fuses, antifuses, etc. For convenience of explanation, the master and address fuses are assumed to be laser fuses, though they may alternatively be electrical fuses.

Figure 3:
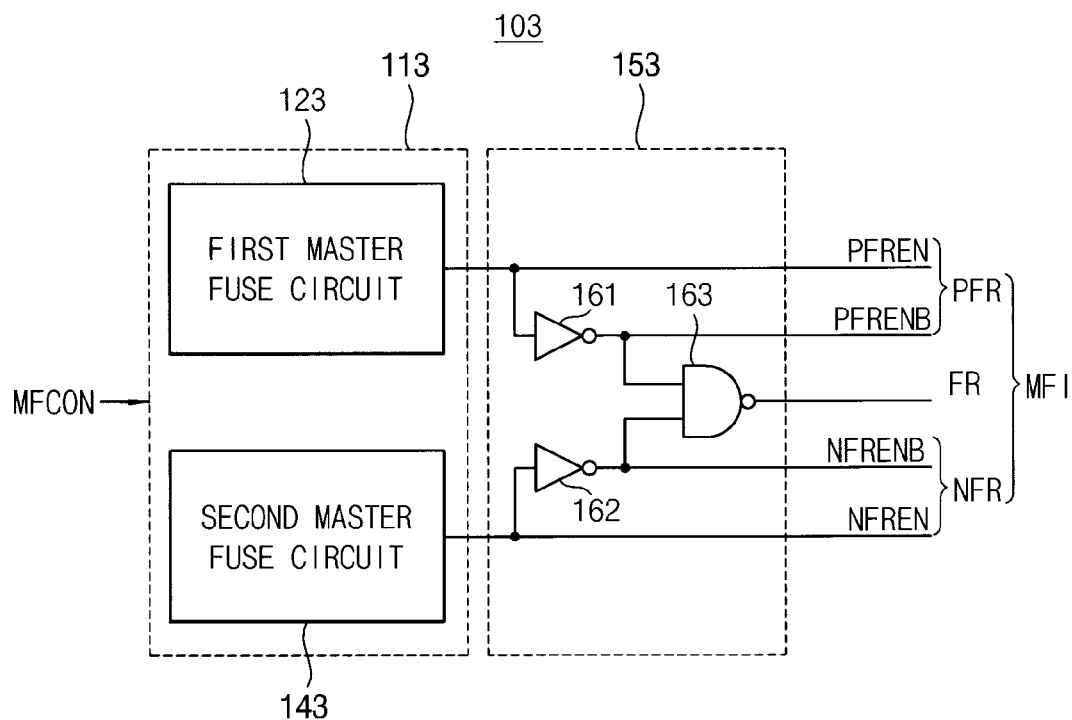
FIG. 3 is a diagram illustrating an example embodiment of the master fuse unit in the fuse unit of FIG. 2.

FIG. 3 is a diagram illustrating an example embodiment of the master fuse unit in the fuse unit of FIG. 2.

Referring to FIG. 3, a master fuse unit 103 may include a master fuse block 113 and a first logic circuit 153.

A master fuse block 113 may include a first master fuse circuit 123 and a second master fuse circuit 143. The first master fuse circuit 123 may include a first master fuse and the second master fuse circuit 143 may include a second master fuse. In an example embodiment, the first master fuse may store a normal cutting mode signal PFREN indicating whether the normal cutting operation is performed. The second master fuse may store a reverse cutting mode signal NFREN indicating whether the reverse cutting operation is performed. In another example embodiment, the first master fuse may store the fuse activation FR signal indicating whether the fuse unit 103 is activated to store the address information signal AFI. The second master fuse may store the reverse cutting mode signal NFREN indicating whether the reverse cutting operation is performed on the address fuses. In this case, the fuse activation signal FR may be reconstructed by first master fuse circuit 123 without logical operations by the first logic circuit 153, and thus the first logic circuit 153 may be omitted. In addition, the normal cutting mode signal PFREN may be generated by inverting the reverse cutting mode signal NFREN.

During the fuse program operation mode, the first master circuit and second master circuit 123 and 143 may perform the normal cutting operation and the reverse cutting operation on the first master fuse and the second master fuse, respectively. In one embodiment, when the address fuse circuit 211 performs the normal cutting operation, the first master fuse is programmed to store information indicating that the normal cutting operation has been performed on the address fuses. When the address fuse block 211 performs the reverse cutting operation, the second master fuse is programmed to store information indicating that the reverse cutting operation has been performed on the address fuses. As will be described with reference to FIGS. 17 and 18, the master fuse unit 103 may perform the normal cutting operation and reverse cutting operation on the master fuses based on the fuse program control signal FCON generated based on the majority bit of repair address bits having one of the first logic level (e.g., '0') and the second logic level (e.g., '1').

During the fuse read-out operation mode, in one embodiment, the first master fuse circuit 123 may generate a normal cutting mode signal PFREN by detecting program states of the first master fuse. The second master fuse circuit 143 may generate a reverse cutting mode signal NFREN by detecting program states of the second master fuse. For example, the normal cutting mode signal PFREN and the reverse cutting mode signal NFREN are one-bit signals having '1' or '0'. The first logic circuit 153 may generate the fuse activation signal FR by performing a logical operation on the normal cutting mode signal PFREN and the reverse cutting mode signal NFREN.

When neither the normal cutting operation nor the reverse cutting operation is performed, the normal cutting mode signal PFREN and the reverse cutting mode signal NFREN may be deactivated into the deactivation level (e.g., '0'). This case may indicate that no valid repair address signal has been stored in the address fuses. Furthermore, this case may indicate that the repair address signal stored in the address fuses is not valid. In an example embodiment, the first logic circuit 153 may further generate an inverted fuse activation signal FRB by inverting the fuse activation signal FR. The inverted fuse activation signal FRB may have the deactivation level (e.g., '0') when the fuse unit 301 is activated.

In an example embodiment, the first logic circuit 153 may include a NAND gate 163, a first inverter 161 and a second inverter 162. The first inverter 161 may invert the normal cutting mode signal PFREN to generate an inverted normal cutting mode signal PFRENB. The first inverter 162 may invert the reverse cutting mode signal NFREN to generate an inverted reverse cutting mode signal NFRENB. The NAND gate 163 may generate the fuse activation signal FR by performing a NAND logical operation on the inverted normal cutting mode signal PFRENB and the inverted reverse cutting mode signal NFRENB.

In an example embodiment, the cutting mode signal CM of FIG. 2 may be two bit signals including the normal cutting mode signal PFREN and the reverse cutting mode signal NFREN. In another example embodiment, the cutting mode signal CM of FIG. 2 may be four bit signals including the normal cutting mode signal PFREN, the inverted normal cutting mode signal PFRENB, the reverse cutting mode signal NFREN and the inverted reverse cutting mode signal NFRENB.

For convenience of illustration, the FIG. 3 illustrates a specific configuration of the first logic circuit 153. However, the first logic circuit 153 may be implemented to have different configurations such that the first logic circuit 153 performs substantially the same functions as described above. For an example, the first logic circuit 153 may be implemented to output the inverted fuse activation signal FRB instead of the fuse activation signal FR. For another example, the first logic circuit 153 may be implemented to include an exclusive OR (XOR) gate instead of the NAND gate 163.

Figure 4:
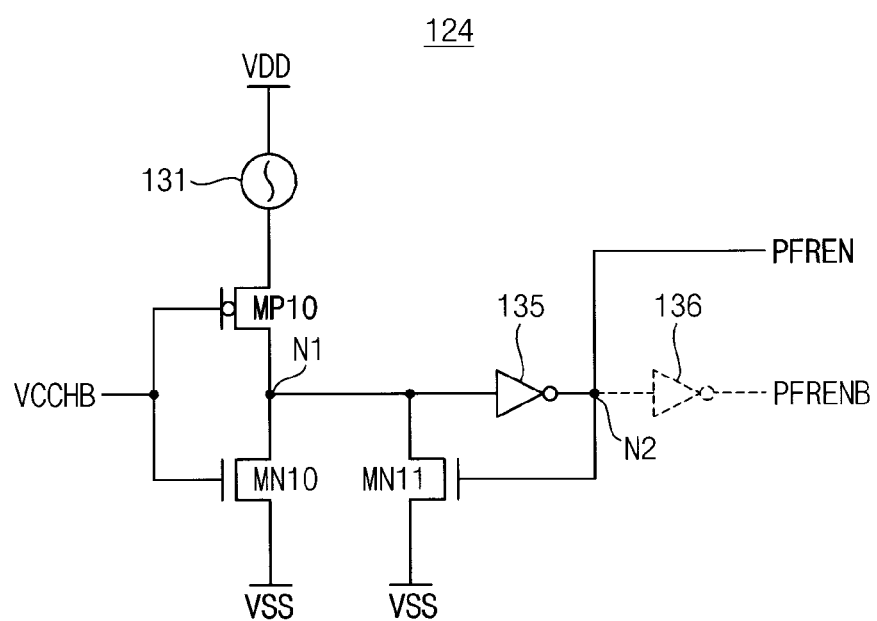
FIG. 4 is a circuit diagram illustrating an example embodiment of one master fuse circuit in the master fuse unit of FIG. 3.

FIG. 4 is a circuit diagram illustrating an example embodiment of one master fuse circuit in the master fuse unit of FIG. 3.

Referring to FIG. 4, a master fuse circuit 124 may include a master fuse 131, a first P-type transistor MP10 and a first N-type transistor MN10. The master fuse 131 may be connected between a first supply voltage VDD and the first P-type transistor MP10. The first N-type transistor MN10 may be connected between the first P-type transistor MP10 and a second supply voltage VSS. An inverted power-up control signal VCCHB may be applied to gates of the first P-type transistor MP10 and the first N-type transistor MN10. The inverted power-up control signal VCCHB may generate a high pulse signal (or alternatively, a non-inverted power-up control signal may generate a low pulse signal) when a power supply voltage (e.g., VDD) is initially applied to a certain circuit or a semiconductor device. Hereinafter, for convenience of illustrating, the inverted power-up control signal VCCHB is assumed as a high pulse signal. Thus, when the power supply voltage is initially applied, a voltage level of a first node N1 between the first P-type transistor MP10 and the first N-type transistor MN10 may be controlled to have voltage levels corresponding to the first supply voltage VDD or the second supply voltage VSS based on the program state of the master fuse 131. For example, for a VCCHB that is a high pulse signal, when the master fuse 131 is cut, then the signal at node N1 becomes low (VSS), and the signal PFREN at node N2 becomes high, and if the master fuse 131 is not cut, then the signal at node N1 becomes high (VDD) and the signal PFREN at node N2 becomes low. In one embodiment, the N-type transistors may be N-type metal-oxide semiconductor (NMOS) transistors and the P-type transistors may be P-type metal-oxide semiconductor (PMOS) transistors.

The master fuse circuit 124 may further include a second N-type transistor MN11 and a first inverter 135. The second N-type transistor MN11 may be connected between the first P-type transistor MP10 and the second supply voltage VSS. The first inverter 135 may invert the output voltage of the first node N1 and may output the normal cutting mode signal PFREN through a second node N2 that is connected to an output of the first inverter 135 and a gate of the second N-type transistor MN11. When the master fuse 131 is cut, the first inverter 135 and the second N-type transistor MN11 may stabilize the voltage level of the first node N1 and the second node N2 in response to the inverted power-up control signal VCCHB. Accordingly, the normal cutting mode signal PFREN has activation level, '1'. Alternatively, when the master fuse 131 is not cut, the first node N1 has a high level voltage (e.g., VDD) in response to the inverted power-up control signal VCCHB. Accordingly, the normal cutting mode signal PFREN has deactivation level, '0'. In an example embodiment, the master fuse circuit 124 may further include a second inverter 136 that outputs the inverted normal cutting mode signal PFRENB by inverting the normal cutting mode signal PFREN of the second node N2.

In an example embodiment, the first master fuse circuit 123 in FIG. 3 may output the normal cutting mode signal PFREN and the inverted normal cutting mode signal PFRENB based on the program state of the first master fuse of the first master fuse circuit 123. The second master fuse circuit 143 in FIG. 3 may output the reverse cutting mode signal NFREN and the inverted reverse cutting mode signal NFRENB based on the program state of the second master fuse of the second master fuse circuit 143.

Figure 5:
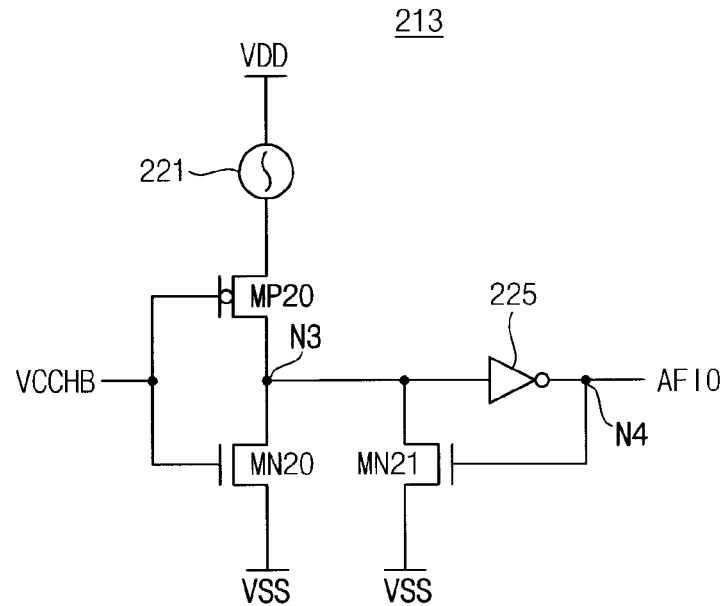
FIG. 5 is a circuit diagram illustrating an example embodiment of one address fuse circuit in the address fuse unit of FIG. 2.

FIG. 5 is a circuit diagram illustrating an example embodiment of one address fuse circuit in the address fuse unit of FIG. 2. Although FIG. 5 illustrates an example of the address fuse circuit including only one address fuse, the address fuse circuit 211 in FIG. 2 may have a configuration including more than one address fuse circuit.

Referring to FIG. 5, an address fuse circuit 213 may include an address fuse 221, a second P-type transistor MP20 and a third N-type transistor MN20. The address fuse 221 may be connected between the first supply voltage VDD and the second P-type transistor MP20. The third N-type transistor MN20 may be connected between the second P-type transistor MP20 and the second supply voltage VSS. An inverted power-up control signal VCCHB may be applied to gates of the second P-type transistor MP20 and the third N-type transistor MN20. The address fuse circuit 213 may further include a fourth N-type transistor MN21 and a third inverter 225. The fourth N-type transistor MN21 may be connected between the second P-type transistor MP20 and the second supply voltage VSS. The third inverter 225 may invert the output voltage of the third node N3 and may output one bit AFI0 of the address information signal AFI through a fourth node N4 that is connected to an output of the third inverter 225 and a gate of the fourth N-type transistor MN21. The address fuse circuit 213 may have different circuit configuration such that output the address information signal AFI based on the program state of the address fuses. In one embodiment, the address fuse circuit 213 has similar configuration to the master fuse circuit 124, and thus a repeated description will be omitted.

Figure 6A:
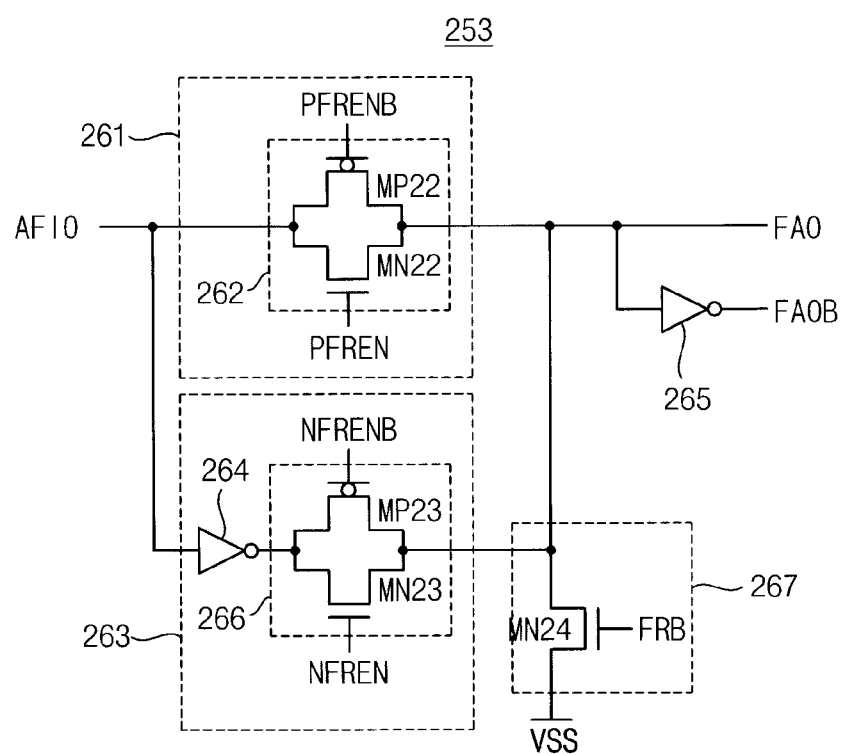
FIGS. 6A, 6B and 6C are circuit diagrams illustrating example embodiments of the second logic circuit in the fuse unit of FIG. 2.
Figure 6B:
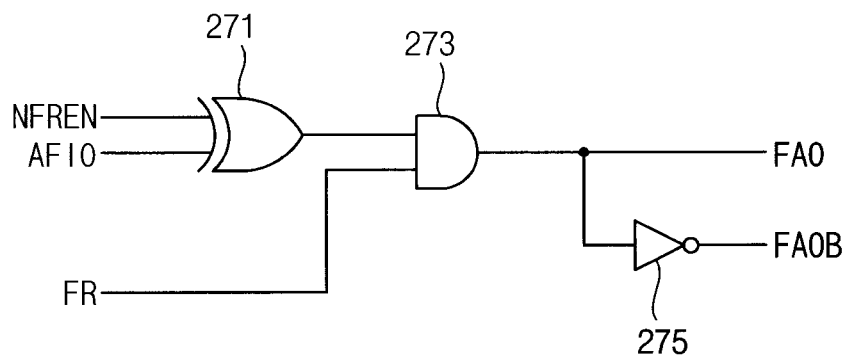
Figure 6C:
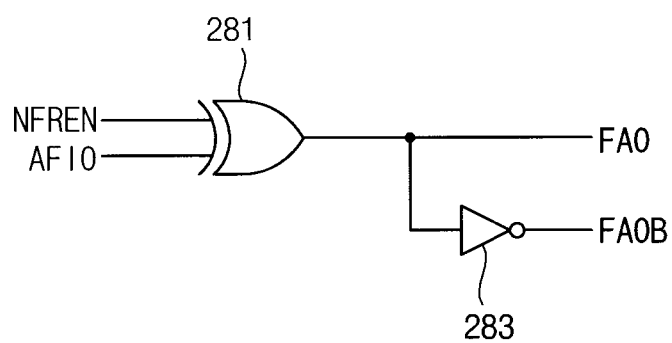

FIGS. 6A, 6B and 6C are circuit diagrams illustrating example embodiments of the second logic circuit in the fuse unit of FIG. 2. Although each of FIGS. 6A, 6B and 6C illustrate examples only for the one bit FA0 of the fuse address signal FA in FIG. 2, the second logic circuit 251 in FIG. 2 may have a configuration including more than one second logic circuit such as illustrated in FIGS. 6A, 6B and 6C.

Referring to FIGS. 2 and 6A, the second logic circuit 251 of the fuse unit 301 may include a first output circuit 261 and a second output circuit 263. The first output circuit 261 may output the address information signal AFI0 as the fuse address signal FA0 without inversion when the cutting mode signal CM indicates the normal cutting operation is performed. The second output circuit 263 may perform bitwise inversion on the address information signal AFI0 to output the inverted address information signal as the fuse address signal FA0 when the cutting mode signal CM indicates the reverse cutting operation is performed. Thus, the second logic circuit 251 may selectively output the address information signal AFI0 or the inverted address information signal as the fuse address signal FA0, in response to the normal cutting mode signals PFREN and PFRENB and the reverse cutting mode signals NFREN and NFRENB. In this case, the cutting mode signal CM is a four bit signal that includes the normal cutting mode signal PFREN, the inverted normal cutting mode signal PFRENB, the reverse cutting mode signal NFREN and the inverted reverse cutting mode signal NFRENB.

The second logic circuit 251 of the fuse unit 301 may include a first transmission gate 262, an inverter 264 and a second transmission gate 266. The first transmission gate 262 may output the address information signal AFI0 as the fuse address signal FA0 when the cutting mode signal CM indicates that the normal cutting is performed or when the normal cutting mode signal PFREN has the logic high level '1'. The inverter 264 may invert the address information signal AFI0. The second transmission gate 266 may output the inverted address information signal as the fuse address signal FA0 when the cutting mode signal CM indicates that the reverse cutting is performed, that is, when the reverse cutting mode signal NFREN has the logic high level '1'. In an example embodiment, the first transmission gate 262 may include two transistors MP22 and MN22 that are controlled to transmit the address information signal AFI0 based on the inverted normal cutting mode signal PFRENB and the normal cutting mode signal PFREN, respectively. Moreover, the second transmission gate 266 may include two transistors MP23 and MN23 that are controlled to transmit the output of the inverter 264 based on the inverted reverse cutting mode signal NFRENB and the reverse cutting mode signal NFREN, respectively.

In other example embodiments, when the master fuse unit 101 complementarily generates signals PFREN and NRFEN, the reverse cutting mode signal NFREN may substitute the inverted normal cutting mode signal PFRENB and the normal cutting mode signal PFREN may substitute the inverted reverse cutting mode signal NFRENB.

The second logic circuit 251 of the fuse unit 301 may further include a stabilizing circuit 267. The stabilizing circuit 267 may stabilize each bit of the fuse address signal FA to the deactivation level or the logic low level when the fuse activation signal FR is in a deactivation state. As described above, the activation state indicates that the fuse unit 301 is not activated so that the fuse unit 301 does not store any valid redundancy address, or indicates that the fuse unit 301 is under the fuse deactivation mode. As illustrated in FIG. 6A, the stabilizing circuit 267 may be implemented as a transistor MN24 connected between the fuse address signal FA0 and the second supply voltage VSS. The stabilizing circuit 267 may receive an inverted fuse activation signal FRB through the gate of the transistor MN24, and thus the fuse address signal FA0 may be stabilized to the second supply voltage VSS based on the inverted fuse activation signal FRB. As described above, the second supply voltage VSS may be a relatively low voltage among supply voltages. For example, the second supply voltage VSS may be a ground voltage. In an example embodiment, the second logic circuit 251 of the fuse unit 301 may further include an additional inverter 265 that inverts the fuse address signal FA0 and outputs the inverted fuse address signal FA0B.

Referring to FIG. 6B, a second logic circuit 255 may include a first logic gate 271, a second logic gate 273 and a third logic gate 275, for one bit of the fuse address signal FA of FIG. 2. The first logic gate 271 may perform a first logical operation on the address information signal AFI0 and the reverse cutting mode signal NFREN. The second logic gate 273 may generate the fuse address signal FA0 by performing a second logic operation on the output of the first logic gate 271 and the fuse activation signal FR. The third logic gate 275 may generate the inverted fuse address signal FA0B by performing a third logical operation on the output of the second logic gate 273. As illustrated in FIG. 6B, in an example embodiment, the first logic gate 271 may be a XOR gate, the second logic gate 273 may be a AND gate and the third logic gate 275 may be an inverter. As described above, FIG. 6B shows logic configuration for one bit of the fuse address signal FA of FIG. 2. The bits of the fuse address signal FA of FIG. 2 may be respectively generated using substantially the same logic configuration illustrated in FIG. 6B.

FIG. 6C illustrates a second logic circuit 257 when the fuse unit 301 has an activation state. Referring to FIG. 6C, the second logic circuit 257 may include a fourth logic gate 281 and a fifth logic gate 283, for one bit of the fuse address signal FA of FIG. 2. The fourth logic gate 281 may generate the fuse address signal FA0 by performing a fourth logic operation the reverse cutting mode signal NFREN and the address information signal AFI0. The fifth logic gate 283 may generate the inverted fuse address signal FA0B by performing a fifth logical operation on the output of the fourth logic gate 281. As illustrated in FIG. 6C, in an example embodiment, the fourth logic gate 281 may be a XOR gate and the fifth logic gate 283 may be an inverter. As described above, FIG. 6C shows logic configuration for one bit of the fuse address signal FA of FIG. 2. The bits of the fuse address signal FA of FIG. 2 may be respectively generated using substantially the same logic configuration illustrated in FIG. 6C.

Figure 7:
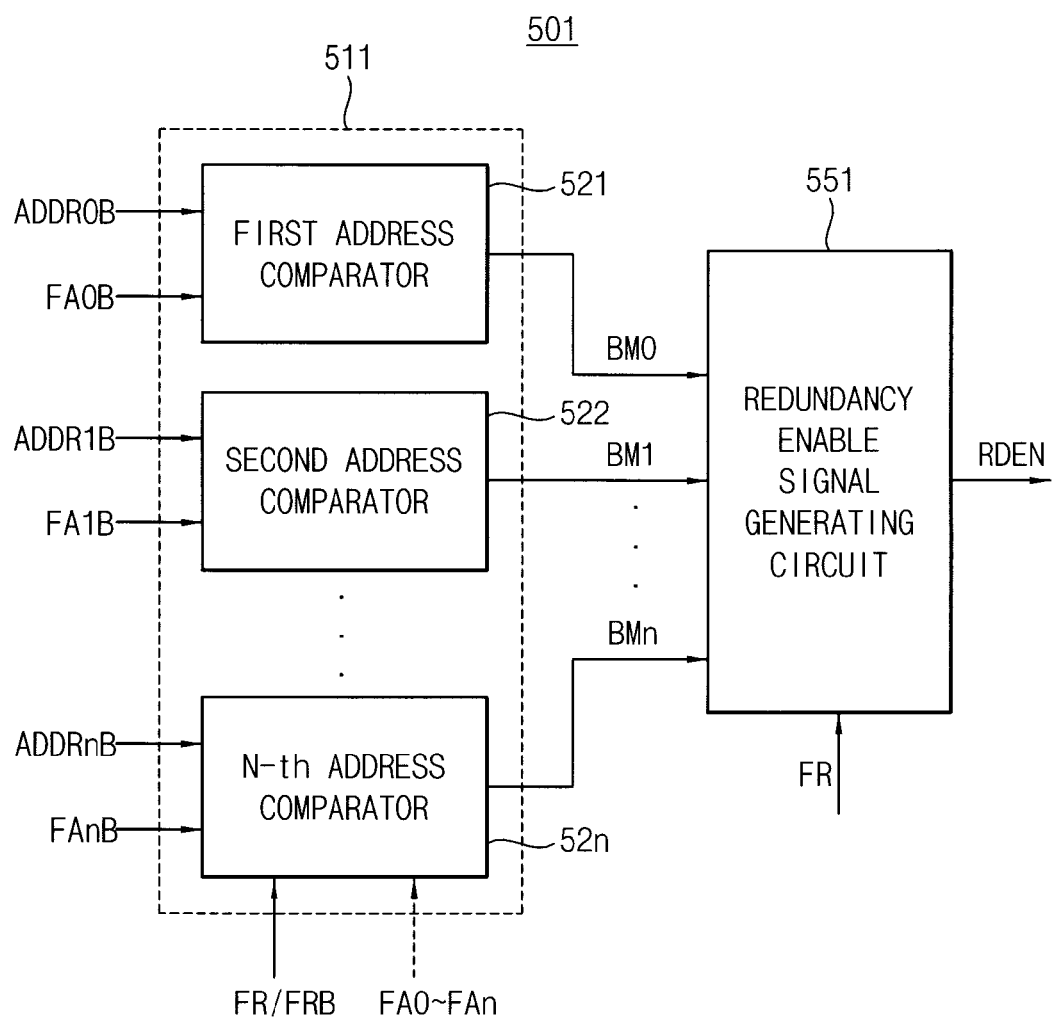
FIG. 7 is a block diagram illustrating an example embodiment of the redundancy control signal generating unit in the redundancy control circuit of FIG. 1.

FIG. 7 is a block diagram illustrating an example embodiment of the redundancy control signal generating unit in the redundancy control circuit of FIG. 1.

Referring to FIG. 7, the redundancy control signal generating unit 501 may include an address comparison block 511 and a redundancy enable signal generating circuit 551.

The address comparison block 511 may compare a fuse address signal FA to an input address signal ADDR or may compare an inverted fuse address signal FAB to an inverted input address signal ADDRB. For example, in one embodiment, the address comparison block 511 may include a plurality of address comparators 521, 522, ..., 52n that compare bits of the inverted input address signal ADDR0B, ADDR1B, ADDRnB to respective bits of the inverted fuse address signal FA0B, FA1B, FAnB. The address comparators 521, 522, ..., 52n may output respective comparison output signals BM0, BM1, ..., BMn based on the respective comparison results. For example, each of the comparison output signals BM0, BM1, BMn may have the logic high level when each bit of the inverted input address signal ADDRB is substantially the same as a corresponding bit of the inverted fuse address signal FAB. Contrarily, each of the comparison output signals BM0, BM1, ..., BMn may have the logic low level when each bit of the inverted input address signal ADDRB is not substantially the same as a corresponding bit of the inverted fuse address signal FAB.

The redundancy enable signal generating circuit 551 may perform logical operations on the comparison output signals BM0, BM1, ..., BMn and the fuse activation signal FR of the master fuse signal MFI to generate the redundancy enable signal RDEN. For example, during the fuse activation mode, the redundancy enable signal generating circuit 551 may activate the redundancy enable signal RDEN into the activation level when each of the comparison output signals BM0, BM1, ..., BMn has the logic high level. On the contrary, during the fuse activation mode, the redundancy enable signal generating circuit 551 may deactivate the redundancy enable signal RDEN into the deactivation level when one of the comparison output signals BM0, BM1, ..., BMn has the logic low level. During the fuse deactivation mode, the redundancy enable signal generating circuit 551 may activate the redundancy enable signal RDEN into the deactivation level regardless of levels of the comparison output signals BM0, BM1, ..., BMn.

Figure 8:
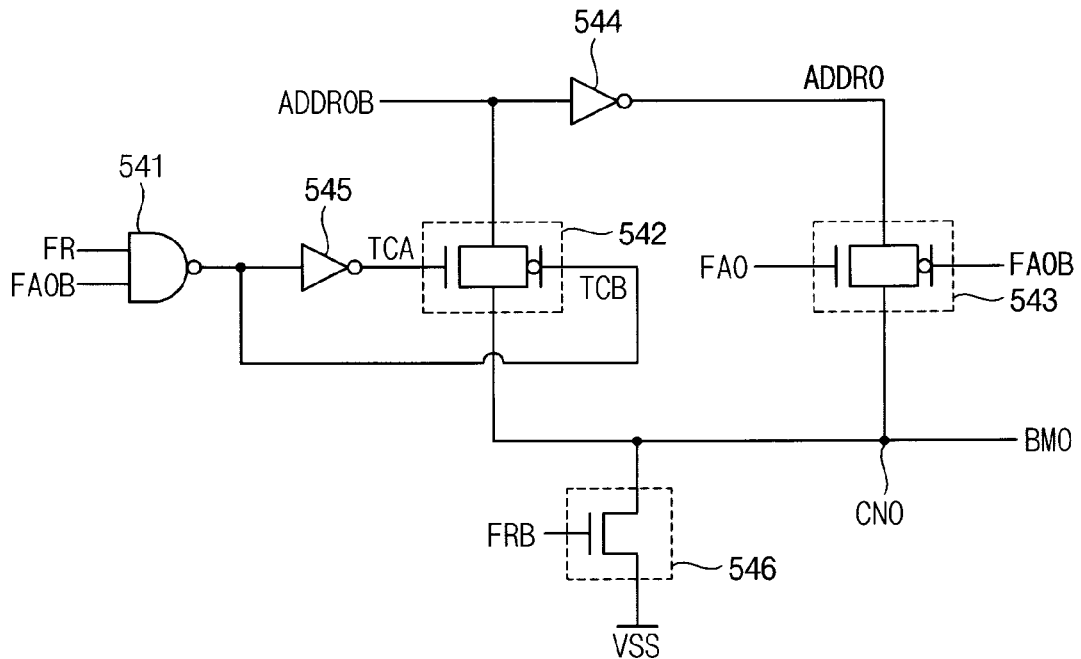
FIG. 8 is a circuit diagram an example embodiment of one address comparator in the redundancy control signal generating unit of FIG. 7.

FIG. 8 is a circuit diagram of an example embodiment of one address comparator in the redundancy control signal generating unit of FIG. 7. Although, FIG. 8 illustrates an example for comparing only one bit FA0B of the inverted fuse address signal FAB to one bit ADDR0B of the inverted input address signal ADDRB of FIG. 7, the address comparison block 511 in FIG. 7 may have a configuration including more than one address comparators such as illustrated in FIG. 8.

Referring to FIG. 8, an address comparator 512 may include a first logic gate 541, a second logic gate 545, a third logic gate 544, a first transmission gate 542 and a second transmission gate 543. The logic gate 541 may generate a first transmission gate control signal TCB by performing a first logical operation on the fuse activation signal FR and the inverted fuse address signal FA0B. For example, the first logic gate 541 may be a NAND gate. The second logic gate 545 may generate a second transmission gate control signal TCA by performing a second logical operation on the first transmission gate control signal TCB. For example, the second logic gate 545 may be an inverter. The first transmission gate 542 may output the comparison output signal BM0 through an output node CN0 based on the inverted input address signal ADDR0B, in response to the transmission gate control signals TCA and TCB. As described above, the comparison output signal BM0 may indicate whether the inverted input address signal ADDR0B is substantially the same as the inverted fuse address signal FA0B. For example, the first transmission gate 542 may include two transistors that transition between a turn-on state and a turn-off state in response to the respective transmission gate control signals TCA and TCB. The third logic gate 544 may generate an input address signal ADDR0 by performing a third logical operation on the inverted input address signal ADDR0B. For example, the third logic gate 544 may be an inverter. The second transmission gate 543 may output the comparison output signal BM0 through the output node CN0 based on the input address signal ADDR0, in response to the fuse address signal FA0 and the inverted fuse address signal FA0B. For example, the second transmission gate 543 may include two transistors that transition between the turn-on state and the turn-off state in response to the respective fuse address signals FA0 and FA0B. In an example embodiment, when the fuse activation signal FR has the activation level, one of the transmission gates 542 and 543 may have a signal transmitting state or an open state according to the logic level of the fuse address signals FA0 and FA0B. The fuse address signal FA0 can be generated by receiving the inverted address signal FA0B in the address comparator 512 or can be received externally from the address comparator 512.

In an example embodiment, the address comparator 512 may further include a switching element 546 connected between the output node CN0 and the second supply voltage VSS. The switching element 546 may stabilize the output node CN0 to the second supply voltage VSS when the inverted fuse activation signal FRB has the activation level. For example, the switching element 546 includes an N-type transistor such as an NMOS transistor. In this case, the N-type transistor may receive the inverted fuse activation signal FRB through the gate.

As described above, when the fuse activation signal FR has the activation level, the address comparator 512 may output the comparison output signal BM0 having the logic high level '1' when the inverted input address signal ADDR0B is substantially the same as the inverted fuse address signal FA0B. On the contrary, the address comparator 512 may output the comparison output signal BM0 having the logic low level '0' when the inverted input address signal ADDR0B is not substantially the same as the inverted fuse address signal FA0B. In contrast, when the fuse activation signal FR has the deactivation level, the address comparator 512 may output the comparison output signal BM0 having the logic low level '0' regardless of whether the inverted input address signal ADDR0B is substantially the same as the inverted fuse address signal FA0B or not.

In an example embodiment, each of the address comparators 521, 522, . . . , 52n in FIG. 7 may be implemented using an XOR gate that performs an XOR operation on the inverted input address signal ADDR0B and the inverted fuse address signal FA0B. In this case, each of the address comparators 521, 522, . . . , 52n in FIG. 7 may further include an inverter that inverts the result of the XOR operation to generate the comparison output signal BM0. In this case, each of the address comparators 521, 522, . . . , 52n in FIG. 7 may output a voltage signal of the logic high level '1' as the comparison output signal BM0 when the inverted input address signal ADDR0B and the inverted fuse address signal FA0B have substantially the same logic level. In contrast, each of the address comparators 521, 522, . . . , 52n in FIG. 7 may output a voltage signal of the logic low level '0' as the comparison output signal BM0 when the inverted input address signal ADDR0B and the inverted fuse address signal FA0B have different logic levels.

Each of the address comparators 521, 522, . . . , 52n of FIG. 7 may be implemented to have substantially the same circuit configuration illustrated in FIG. 8, and thus a repeated description will be omitted.

Figure 9:
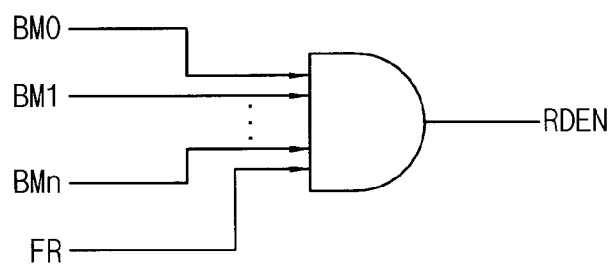
FIG. 9 is a circuit diagram illustrating an example embodiment of the redundancy enable signal generating circuit in the redundancy control signal generating unit of FIG. 7.

FIG. 9 is a circuit diagram illustrating an example embodiment of the redundancy enable signal generating circuit in the redundancy control signal generating unit of FIG. 7.

Referring to FIG. 9, the redundancy enable signal generating circuit 552 may be implemented using an AND gate that receives the comparison output signals BM0, BM1, . . . , BMn and the fuse activation signal FR as input signals and performs an AND operation on the input signals BM0, BM1, . . . , BMn and FR. In this case, when one of the input signals BM0, BM1, . . . , BMn and FR has the logic low level '0', the redundancy enable signal generating circuit 552 deactivate the redundancy enable signal RDEN to the logic low level.

Figure 10:
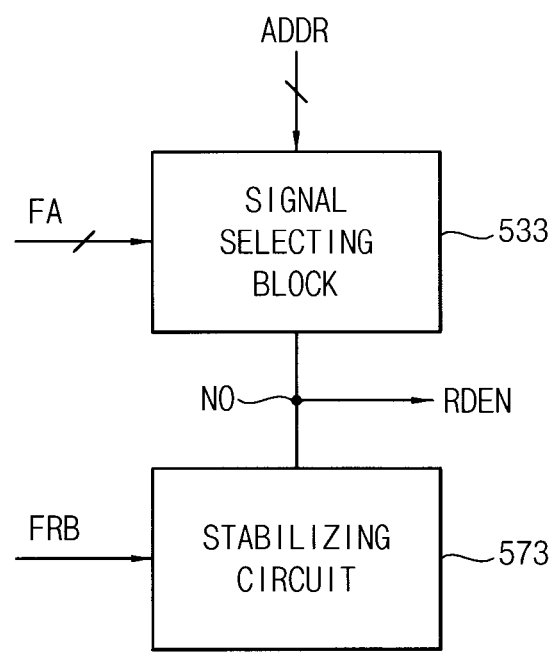
FIG. 10 is a block diagram illustrating another example embodiment of the redundancy control signal generating unit in the redundancy control circuit of FIG. 1.

FIG. 10 is a block diagram illustrating another example embodiment of the redundancy control signal generating unit in the redundancy control circuit of FIG. 1.

Referring to FIG. 10, the redundancy control signal generating unit 503 may include a signal selecting block 533 and a stabilizing circuit 573.

The signal selecting block 533 may detect whether the input address signal ADDR is substantially the same as the fuse address signal FA and may generate the redundancy enable signal RDEN based on the detection result. The signal selecting block 533 may output the redundancy enable signal RDEN through an output node N0 based on the input address signal ADDR and the fuse address signal FA when the output node N0 is not stabilized by the stabilizing circuit 573. For example, as will be described with reference to FIG. 11, the signal selecting block 533 may perform a demultiplexing operation on a first address signal and select one of demultiplexed signals based on a second address signal to generate the redundancy enable signal RDEN, where the first and second address signals may represent the respective address signals ADDR and FA or may represent the respective address signals FA and ADDR.

The stabilizing circuit 573 may stabilize the output node N0 to a pre-determined logic level base on the inverted fuse activation signal FRB. In this case, the redundancy enable signal RDEN may have a logic level corresponding to the pre-determined logic level. For example, pre-determined logic level may be a logic level of the second supply voltage VSS or may be the deactivation level. The stabilizing circuit 573 may be implemented using a transistor that selectively has a turn-on state or a turn-off state according to the logic level of the inverted fuse activation signal FRB.

In an example embodiment, the redundancy control signal generating unit 503 may receive the address information signal AFI instead of the fuse address signal FA and may receive the master fuse signal MFI instead of the inverted fuse activation signal FRB. As described above, the master fuse signal MFI may include the fuse cutting information CM and the fuse activation signal FR. In this case, the redundancy control signal generating unit 503 may generate the redundancy enable signal RDEN based on the address information signal AFI, the fuse cutting information CM and the fuse activation signal FR. For example, as described with reference to FIGS. 6A, 6B and 6C, the redundancy control signal generating unit 503 may generate the fuse address signal FA by performing logical operations on the received signals AFI, CM and FR.

Figure 11:
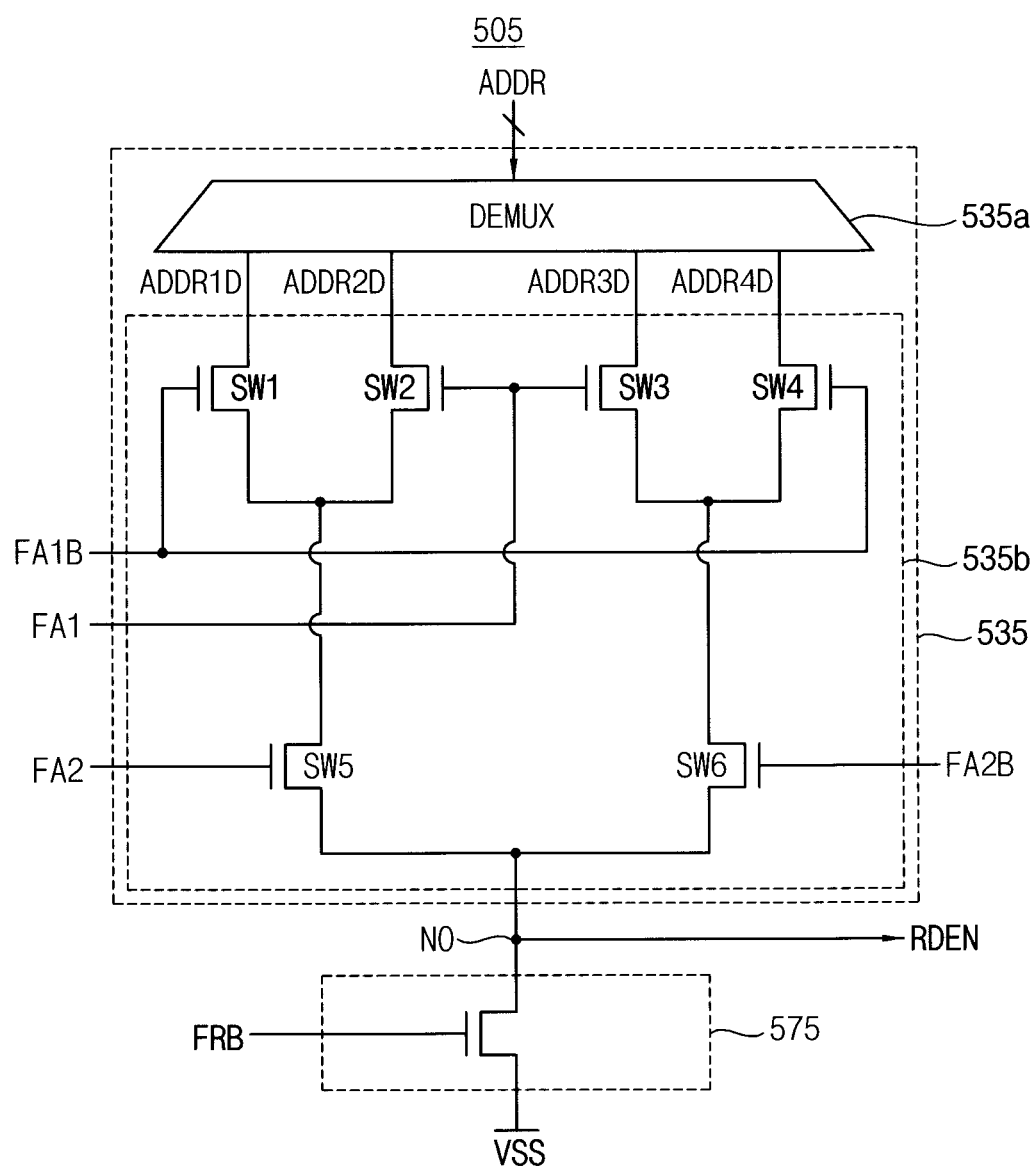
FIG. 11 is a block diagram illustrating an example embodiment of the redundancy control signal generating unit of FIG. 10.

FIG. 11 is a block diagram illustrating an example of the redundancy control signal generating unit of FIG. 10. Although FIG. 11 illustrates an example where the address signals ADDR and FA are two-bit signals, the redundancy control signal generating unit 503 of FIG. 10 may have similar circuit configurations where the address signals ADDR and FA have an arbitrary number of bits. Moreover, although FIG. 11 illustrates an example where one of demultiplexed input address signals are selected based on the fuse address signal FA, one of demultiplexed fuse address signals may be selected based on the input address signal ADDR.

Referring to FIG. 11, the redundancy control signal generating unit 503 may include the signal selecting block 535 and the stabilizing circuit 575.

The signal selecting block 535 may include a demultiplexer 535a and a signal switching circuit 535b. The demultiplexer 535a may generate the demultiplexed input address signals ADDR1D, ADDR2D, ADDR3D and ADDR4D by performing demultiplexing operation on the input address signal ADDR, where the input address signal ADDR has two bits. The signal switching circuit 535b may include a plurality of first switching elements SW1, SW2, SW3 and SW4 and a plurality of second switching elements SW5 and SW6. The first switching elements SW1, SW2, SW3 and SW4 may be connected to the respective demultiplexed input address lines ADDR1D, ADDR2D, ADDR3D and ADDR4D. The second switching element SW5 may be connected between an output node N0 and a pair of the first switching elements SW1 and SW2. The second switching element SW6 may be connected between an output node N0 and the other pair of the first switching elements SW3 and SW4. The switching elements SW1 through SW6 may be controlled to have a short state or an open state based on the fuse address signal FA. The first switching elements SW1, SW2, SW3 and SW4 may be controlled based on a first bit FA1 (or FA1B) of the fuse address signal FA. For example, as illustrated in FIG. 11, the first switches SW1 and SW4 may be controlled based on the inverted first bit FA1B and the other first switches SW2 and SW3 may be controlled based on the first bit FA1. The second switching elements SW5 and SW6 may be controlled based on a first bit FA2 (or FA2B) of the fuse address signal FA.

The stabilizing circuit 575 may include a transistor connected between the output node N0 and the second supply voltage VSS. The stabilizing circuit 575 may receive an inverted fuse activation signal FRB through the gate of the transistor, and thus the redundancy enable signal RDEN may be stabilized to the second supply voltage VSS based on the inverted fuse activation signal FRB. As described above, the second supply voltage VSS may be a relatively low voltage among supply voltages. For example, the second supply voltage VSS may be a ground voltage.

Figure 12:
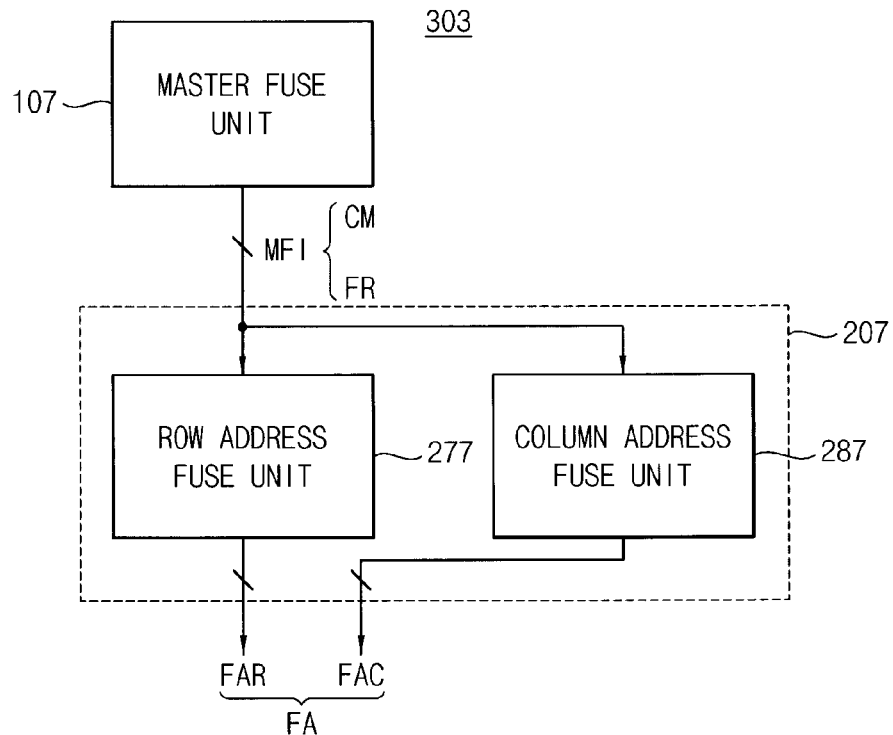
FIG. 12 is a block diagram illustrating another example embodiment of the fuse unit in the redundancy control circuit of FIG. 1.

FIG. 12 is a block diagram illustrating another example embodiment of the fuse unit in the redundancy control circuit of FIG. 1.

Referring to FIG. 12, the fuse unit 303 may include the master fuse unit 107 and the address fuse unit 207. The address fuse unit 207 may include a row address fuse unit 277 and a column address fuse unit 287. In this case, the repair address signal may include a repair row address signal related to the row address fuse unit 277 and a repair column address signal related to the column address fuse unit 287. The row address fuse unit 277 may include a plurality of row address fuses that are programmed to store the repair row address by selectively performing the normal cutting operation or the reverse cutting operation. The column address fuse unit 287 may include a plurality of column address fuses that are programmed to store the repair column address by performing selectively the normal cutting operation or the reverse cutting operation. The row address fuse unit 277 may generate a fuse row address signal FAR based on the master fuse signal MFI received from the master fuse unit 107. The column address fuse unit 287 may generate a fuse column address signal FAC based on the master fuse signal MFI received from the master fuse unit 107. Thus, the fuse address signal FA may include the fuse row address signal FAR and the fuse column address signal FAC. Each of the address fuse units 277 and 287 may have a similar configuration to the address fuse unit 201 in FIG. 2. Moreover, the master fuse unit 107 is similar to the master fuse unit 100. Thus, repeated descriptions will be omitted.

Figure 13:
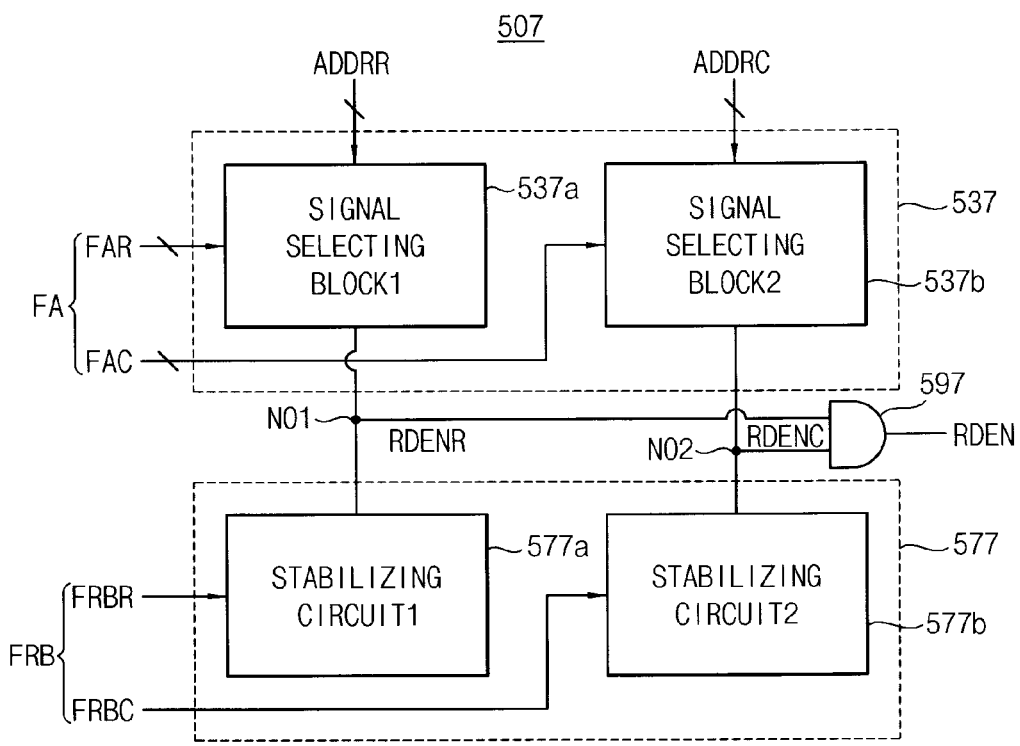
FIG. 13 is a block diagram illustrating another example embodiment of the redundancy control signal generating unit in the redundancy control circuit of FIG. 1.

FIG. 13 is a block diagram illustrating another example embodiment of the redundancy control signal generating unit in the redundancy control circuit of FIG. 1.

Referring to FIG. 13, the redundancy control signal generating unit 507 may include the signal selecting block 537 and the stabilizing block 577. The signal selecting block 537 may detect whether the input address signal ADDR is substantially the same as the fuse address signal FA and may generate the redundancy enable signal RDEN based on the detection result. The input address signal ADDR may include an input row address signal ADDRR and an input column address signal ADDRC. The redundancy enable signal RDEN may include a first redundancy enable signal RDENR and a second redundancy enable signal RDENC.

The signal selecting block 537 may include a first signal selecting block 1 537a and a second signal selecting block 2 537b. The first signal selecting block 1 537a may detect whether an input row address signal ADDRR is substantially the same as the fuse row address signal FAR and may generate a first redundancy enable signal RDENR based on the detection result. The second signal selecting block 2 537b may detect whether an input column address signal ADDRC is substantially the same as the fuse row address signal FAC and may generate a second redundancy enable signal RDENC based on the detection result. The signal selecting blocks 537a and 537b may output the respective redundancy enable signals RDENR and RDENC through respective output nodes NO1 and NO2 when the output nodes NO1 and NO2 is not stabilized by the stabilizing block 577.

The stabilizing block 577 may include a first stabilizing circuit 1 577a and a second stabilizing circuit 2 577b. In this case, the inverted fuse activation signal FR may include a first inverted fuse activation signal FRBR and a second inverted fuse activation signal FRBC. The first stabilizing circuit 1 577a may stabilize the first output node NO1 to a pre-determined logic level base on the first inverted fuse activation signal FRBR. The second stabilizing circuit 2 577b may stabilize the second output node NO2 to the pre-determined logic level base on the second inverted fuse activation signal FRBC. In this case, each of the redundancy enable signals RDENR and RDENC may have a logic level corresponding to the pre-determined logic level. For example, pre-determined logic level may be a logic level of the second supply voltage VSS or may be the deactivation level. The stabilizing circuits 577a and 577b may be implemented using respective transistors, each of which has a turn-on state or a turn-off state.

In an example embodiment, the redundancy control signal generating unit 507 may further include a logic gate 597. The logic gate 597 may perform a logical operation on the redundancy enable signals RDENR and RDENC to generate the redundancy enable signal RDEN. For example, the logic gate 597 may be a AND gate when the activation level is substantially the same as the logic high level.

In one embodiment, the signal selecting blocks 537a and 537b of FIG. 13 are substantially the same as the signal selecting block 533 of FIG. 10 and the stabilizing circuits 577a and 577b of FIG. 13 are substantially the same as the stabilizing circuit 573. Thus, a repeated description will be omitted.

Figure 14:
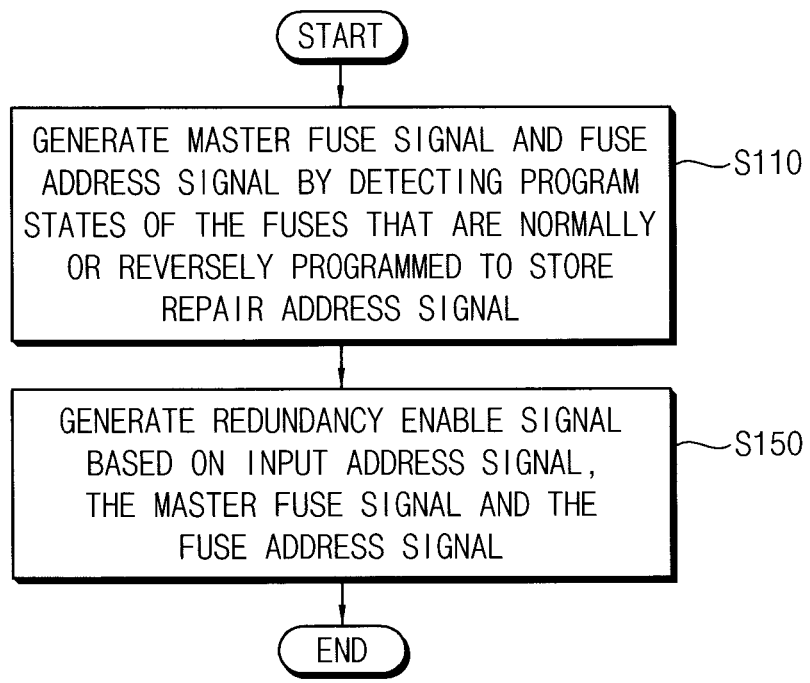
FIG. 14 is a flowchart illustrating a method of generating redundancy control signal according to example embodiments.

FIG. 14 is a flowchart illustrating a method of generating redundancy control signal according to example embodiments.

Referring to FIGS. 1 and 14, the fuse unit 300 generates the master fuse signal MFI and the fuse address signal FA by detecting program states of the plurality of fuses that are normally or reversely programmed with the repair address signal (S110). The redundancy control signal generating unit 500 generates the redundancy enable signal RDEN based on the input address signal ADDR, the master fuse signal MFI and the fuse address signal FA (S150). The steps S110 and S150 may be performed by the redundancy control circuit 100 of FIG. 1, and thus a repeated description will be omitted.

Figure 15:
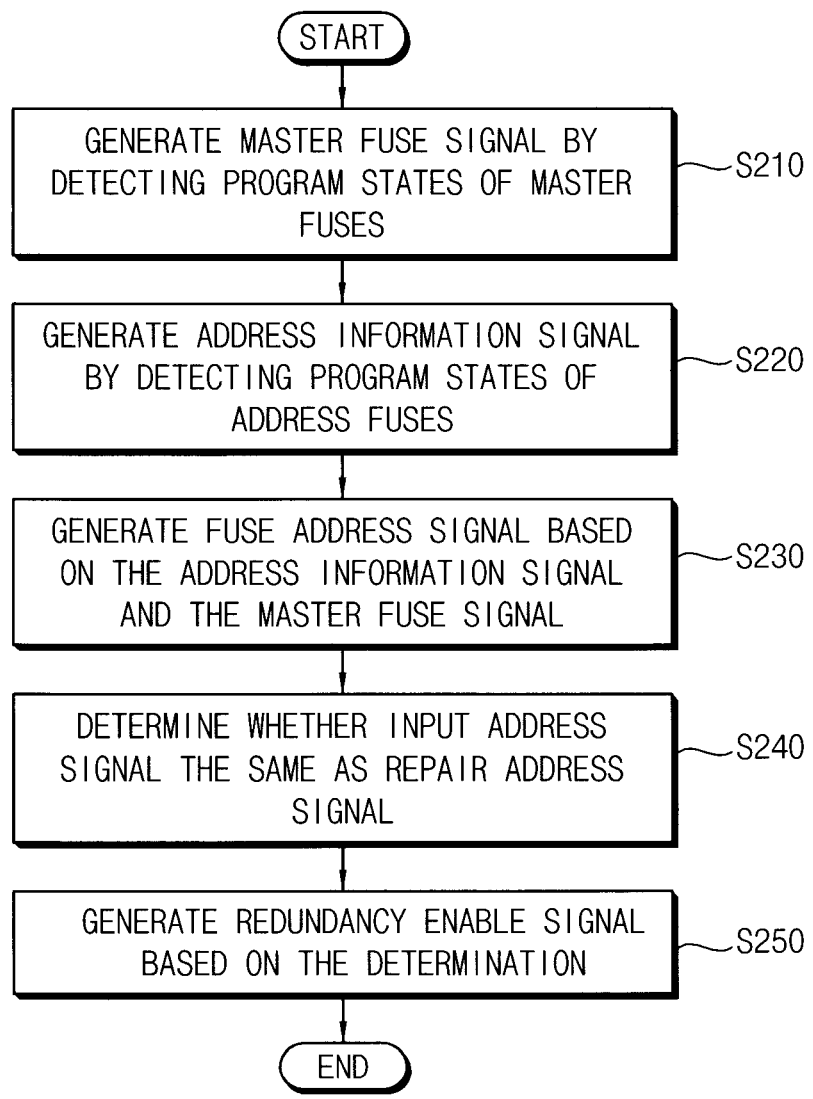
FIG. 15 is a flowchart illustrating an example embodiment of the method of FIG. 14.

FIG. 15 is a flowchart illustrating an example embodiment of the method of FIG. 14.

Referring to FIGS. 1, 2 and 15, the master fuse unit 100 may generate master fuse signal MFI by detecting program states of master fuses (S210). The address fuse circuit 211 may generate an address information signal AFI by detecting program states of address fuses (S220). The address fuse circuit 211 may generate the fuse address signal FA based on the address information signal AFI and the master fuse signal MFI (S230). The redundancy control signal generating unit 500 may determine whether an input address signal ADDR is the same as the repair address signal based on the master fuse signal MFI and the fuse address signal FA (S240) and may generate the redundancy enable signal RDEN based on the determination (S250). The steps S210 through S250 may be performed by the redundancy control circuit 100 of FIG. 1 including the fuse unit 301 of FIG. 2, and thus a repeated description will be omitted.

Figure 16:
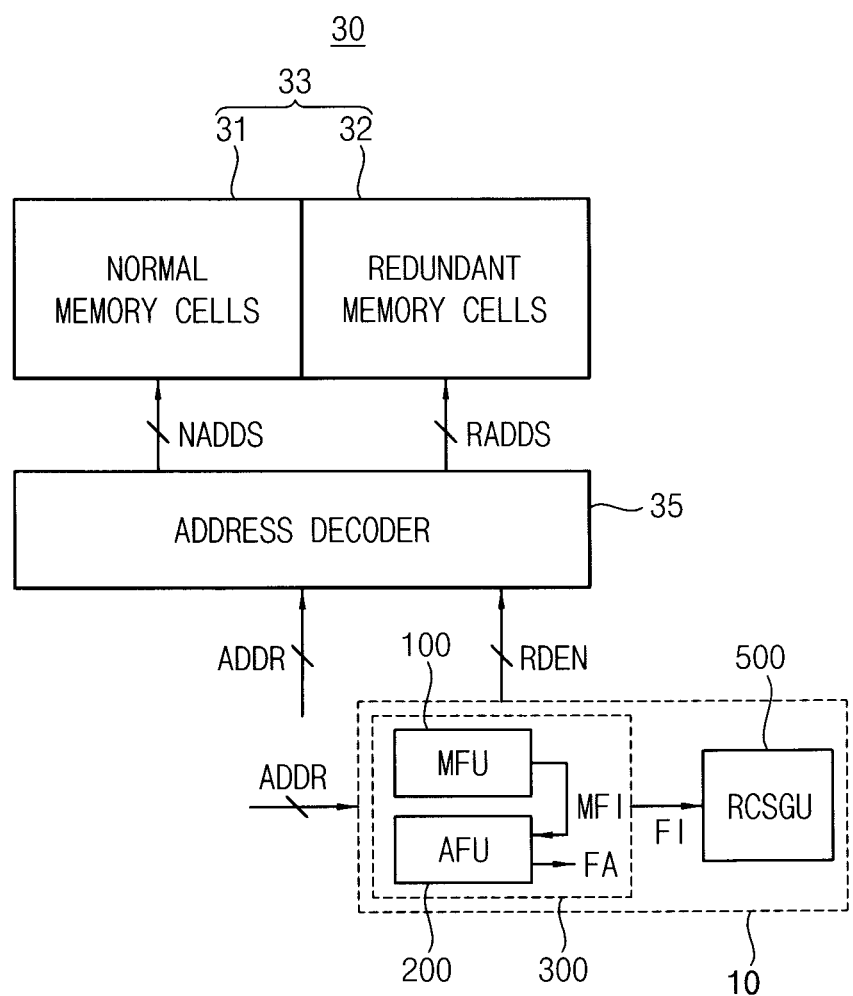
FIG. 16 is a diagram illustrating a memory device according to example embodiments.

FIG. 16 is a diagram illustrating a memory device according to example embodiments.

Referring to FIG. 16, a memory device 30 includes a memory cell unit 33, a redundancy control circuit 10 and an address decoder 35. In example embodiments, the memory device 30 may include, for example, DRAM (including DDR and SDRAM), NAND flash, NOR flash, RRAM, PRAM and MRAM etc., and may be part of a semiconductor chip, a package including a semiconductor chip, a package-on-package device, a semiconductor memory module, etc.

The memory cell unit 33 includes normal memory cells 31 and redundant memory cells 32, where the redundant memory cells 32 are for replacing defective memory cells of the normal memory cells 31. The redundant memory cells 32 may have storage size that is smaller than or the same as the storage size of the normal memory cells 31 because memory space of the redundant memory cells 32 is for substituting the defective memory cells of the normal memory cells 31. The repair operation may be performed using an arbitrary number of bits of memory address of the normal memory cells. For example, the repair operation may be performed based on 10 upper bits of memory address signal where the memory address signal has 12 bits.

The redundancy control circuit 10 may include the fuse unit 300, the redundancy control signal generating unit 500. The fuse unit 300 detects program states of the plurality of fuses that selectively perform the normal cutting operation or the reverse cutting operation based on the repair address signal and generates the master fuse signal MFI and the fuse address signal FA based on the detected program states. The redundancy control signal generating unit 500 generates the redundancy enable signal RDEN depending on whether an input address signal ADDR is substantially the same as the repair address signal based on the master fuse signal MFI and the fuse address signal FA. In an example embodiment, as described with reference to FIG. 12, the repair address signal may include at least one of a row address signal and a column address signal of the defective memory cells of the normal memory cells 31. The redundancy control circuit 10 of FIG. 16 is similar to the redundancy control circuit 10 of FIG. 1, and thus a repeated description will be omitted.

The address decoder 35 performs a decoding operation on the input address signal ADDR based on the redundancy enable signal RDEN to output the decoded input address signal as a normal address signal NADDS or a redundant address signal RADDS to access the normal memory cells 31 or the redundant memory cells 32. For example, when the redundancy enable signal RDEN has the deactivation level, the address decoder 35 output the normal address signal NADDS to the memory cell unit 33 to access the normal memory cells 31. In contrast, when the redundancy enable signal RDEN has the activation level, the address decoder 35 output the redundant address signal RADDS to the memory cell unit 33 to access the redundant memory cells 32.

The memory device 30 according to the example embodiments includes the plurality of fuses performing selectively the normal cutting operation or the reverse cutting operation such that the number of programmed fuses is relatively reduced. Thus, the memory device 30 may relatively stably provide a redundant path to the redundant memory cells 32 against a normal path to the defective memory cells.

Figure 17:
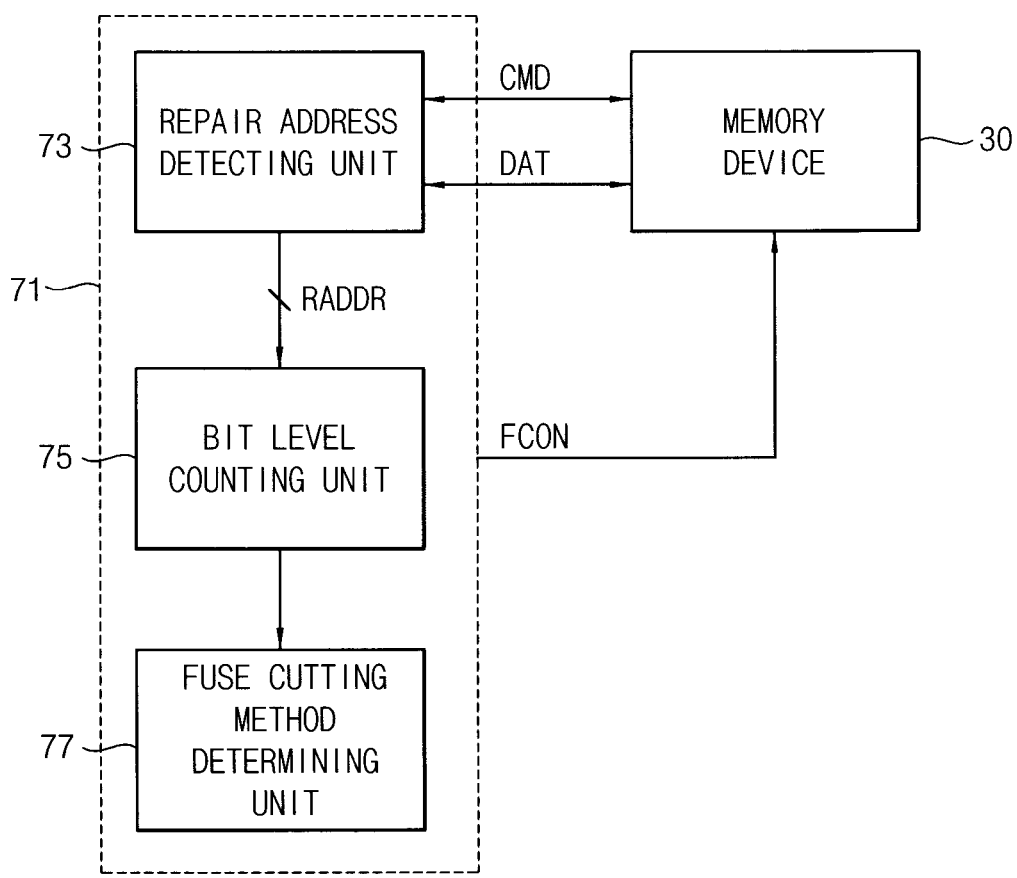
FIG. 17 is a block diagram illustrating a system according to example embodiments.

FIG. 17 is a block diagram illustrating a fuse programming system according to example embodiments.

Referring to FIG. 17, a system 70 includes a fuse programming device 71 and a memory device 30. The fuse programming device 71 includes a repair address detecting unit 73, a bit level counting unit 75 and a fuse cutting method determining unit 77.

The repair address detecting unit 73 may perform test operations on the memory device 30 by transmitting test data through a command line CMD and a data line DAT. The repair address detecting unit 73 may detect at least one repair address signal RADDR based on the results of the test operations, where the repair address RADDR is for accessing the defective memory cells of the memory devices. The bit level counting unit 75 may calculate distributions of bits of the detected repair address signal RADDR. For example, the bit level counting unit 75 may count the number of bits of the repair address signal RADDR, each bit of which has a first logic level or a second logic level. The fuse cutting method determining unit 77 may determine one of the cutting methods for the memory device 30 based on the distributions of the bits and generate a fuse program control signal FCON. The fuse cutting methods may include, for example, a normal cutting method corresponding to the normal cutting operation and a reverse cutting method corresponding to the reverse cutting operation. For example, the fuse cutting method determining unit 77 may generate the fuse program control signal FCON to perform the normal cutting operation when the number of the repair address bits having the first logic level is larger than the number of the repair address bits having the second logic level. In contrast, the fuse cutting method determining unit 77 may generate the fuse program control signal FCON to perform the reverse cutting operation when the number of the repair address bits having the second logic level is larger than the number of the repair address bits having the first logic level. In this case, the first and second logic levels may have the logic high level '1' and the logic low level '0', respectively. Alternatively, the first and second logic levels may have the logic low level '0' and the logic high level '1', respectively. The fuse program control signal FCON may include the repair address signal RADDR as well as control signals for fuse programming.

The memory device 30 may selectively perform the normal cutting operation or the reverse cutting operation on the plurality of address fuses of the fuse unit 300 based on the fuse program control signal FCON. The memory device 30 of FIG. 17 is similar to the memory device 30 of FIG. 16, and thus a repeated description will be omitted.

Figure 18:
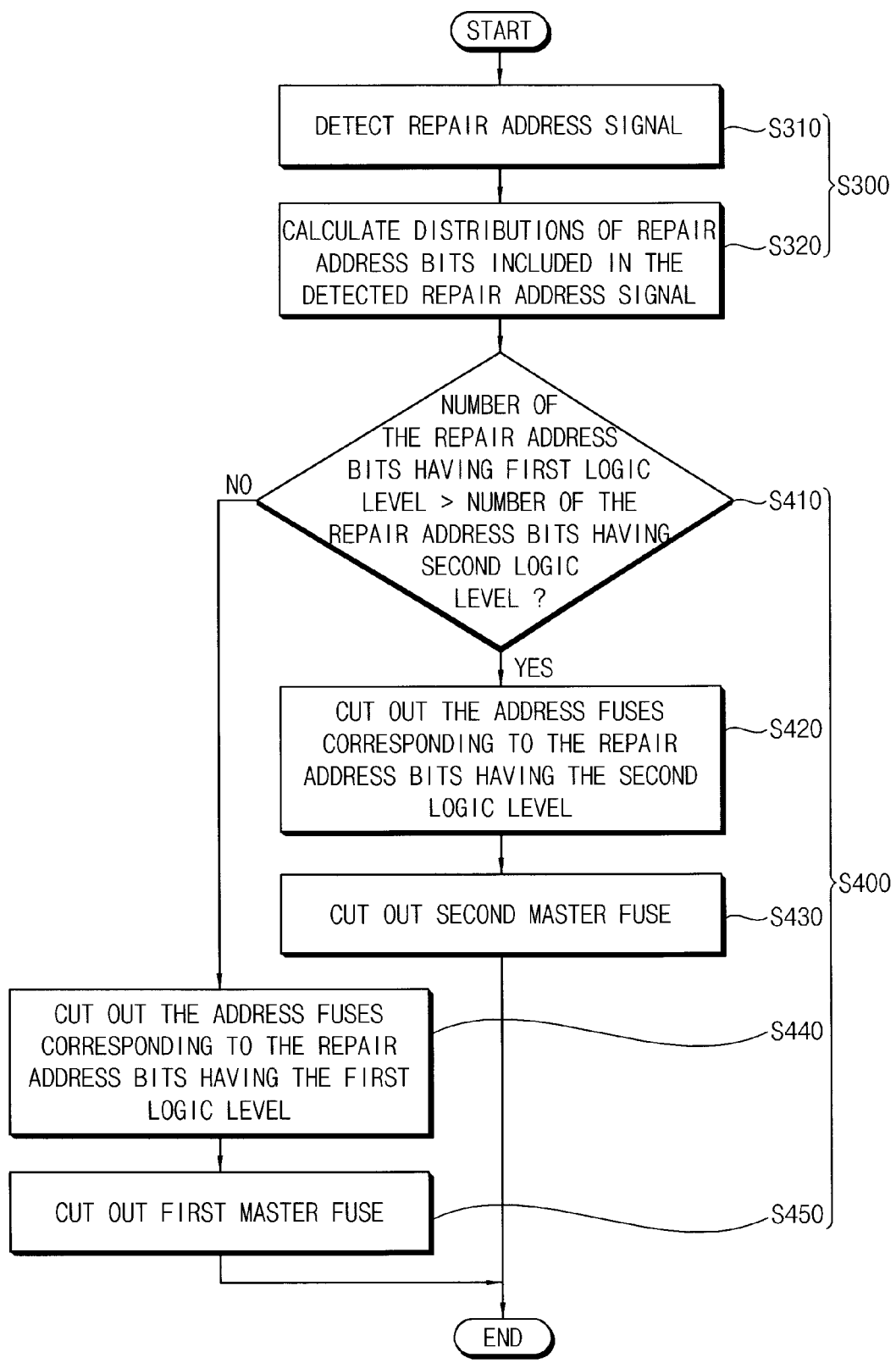
FIG. 18 is a flowchart illustrating a method of programming fuses based on a repair address according to example embodiments.

FIG. 18 is a flowchart illustrating a method of programming fuses based on a repair address according to example embodiments.

Referring to FIGS. 1, 17 and 18, the fuse programming device 71 may detect at least one repair address signal RADDR and may calculate distributions of bits of the detected repair address signal RADDR (S300). The memory device 30 may selectively perform the normal cutting operation or the reverse cutting operations on the address fuses of the fuse unit 300 based on the fuse program control signal FCON generated according to the detection result (S400).

The repair address detecting unit 73 may detect at least one repair address signal RADDR (S310), where the repair address RADDR indicates the defective memory cells of the memory devices. The bit level counting unit 75 may calculate distributions of bits of the detected repair address signal RADDR (S320). The fuse cutting method determining unit 77 may determine one of cutting methods for the memory device 30 based on the distributions of the bits and generate a fuse program control signal FCON. The fuse cutting methods may include a normal cutting method corresponding to the normal cutting operation and a reverse cutting method corresponding to the reverse cutting operation. For example, when the number of the repair address bits having the first logic level is larger than the number of the repair address bits having the second logic level (S410=YES), the fuse cutting method determining unit 77 may generate the fuse program control signal FCON to perform the normal cutting operation. In this case, the address fuses corresponding to the repair address bits having the second logic level may be cut out (S420). Further, the second master fuse of the memory device 30 may be cut out (S430). In contrast, when the number of the repair address bits having the second logic level is larger than the number of the repair address bits having the first logic level (S410=NO), the fuse cutting method determining unit 77 may generate the fuse program control signal FCON to perform the reverse cutting operation. In this case, the address fuses corresponding to the repair address bits having the first logic level may be cut out (S440). Further, the first master fuse of the memory device 30 may be cut out (S450). As described above, the first and second logic levels may have the logic high level '1' and the logic low level '0', respectively. Alternatively, the first and second logic levels may have the logic low level '0' and the logic high level '1', respectively.

The steps S310, S320 and S410 through S450 may be performed by the system 70 including the memory device 30 of FIG. 17, and thus a repeated description will be omitted.

As described with reference to FIGS. 1, 16 and 17, the redundancy control circuit 10, the memory device 30 and the fuse program system 70 according to the example embodiments may relatively reduce the number of programmed fuses by determining fuses to be cut out based on the number of bits having a particular logic level. For example, where the number of the address fuses or the number of bits of the repair address signal is 10, the repair address has seven bits of the first logic level and three bits of the second logic level. Assumed that the first logic level represent a logic level of programmed fuses, according to conventional methods of programming fuses, address fuses corresponding to the seven bits of the first logic level may be programmed. In contrast, according to the example embodiments, address fuses corresponding to the three bits of the second logic level may be programmed so that the address fuses stores an inverted repair address signal. Accordingly, the redundancy control circuit 10, the memory device 30 and the fuse program system 70 may prevent from cutting out more than half of the address fuses.

Figure 19:
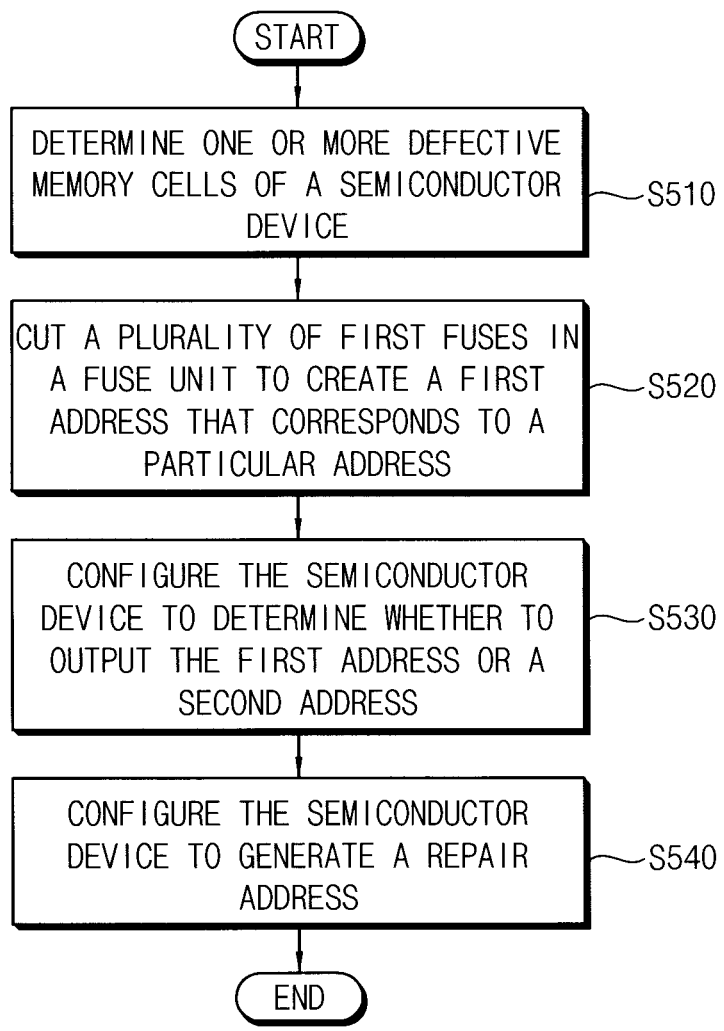
FIG. 19 is a flowchart illustrating a method manufacturing a semiconductor device according to example embodiments.

FIG. 19 is a flowchart illustrating a method manufacturing a semiconductor device according to example embodiments.

Referring to FIGS. 1, 17 and 19, the fuse programming device 71 may determine one or more defective memory cells of a memory device 30 including a first memory cell having a particular address (S510). For the particular address, a plurality of first fuses in a fuse unit 300 may be cut, to create a first address that corresponds to the particular address (S520). In one embodiment, as described above, cutting the plurality of first fuses may include determining to cut one or more of the first fuses corresponding to bits having a first logic level when a majority of bits in the particular address have a second logic level, or determining to cut one or more of the first fuses corresponding to bits having the second logic level when a majority of bits in the particular address have the first logic level. The memory device 30 may then be configured to determine whether to output the first address or a second address that is an inverted address of the first address as a repair address (S530). For example, this may be accomplished by programming another fuse or plurality of fuses that indicate whether the first address or second address should be output. The memory device 30 may then be configured to generate the repair address, wherein a logic level of each of bits of the repair address is the same as that of the defective input address (S540).

As mentioned above, the example embodiments may relatively reduce the number of programmed fuses based on the distribution of bit levels of the repair address signal to be stored in the fuses. Accordingly, the example embodiments may reduce the disadvantages due to the residues around the cut area.

The example embodiments may be employed in different types of memory devices, such as DRAM (including DDR and SDRAM), NAND flash, NOR flash, RRAM, PRAM and MRAM etc. In addition, aspects of the disclosed embodiments may be used in systems such as microprocessor systems, digital signal processors, communication system processors, or other systems that include redundant portions replacing defective normal portions, as well as in embedded memory systems. That is, the example embodiments may be employed in various electronic devices or electronic systems that include fuses storing repair addresses of redundant portions for replacing defective portions such as defective semiconductor circuits, defective integrated circuits, defective memory cells, etc.

The foregoing is illustrative of example embodiments and is not to be construed as limiting thereof. For example, although the example embodiments are mainly described with one repair address signal having two bit levels, the example embodiments may include an arbitrary number of repair address signals with an arbitrary number of bit levels. Further, although the example embodiments are mainly described to repair defective memory cells, the example embodiments may be employed to repair defective semiconductor circuit portions of an electronic device. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A redundancy control circuit comprising:
an address fuse circuit including a plurality of first fuses, wherein each of the first fuses is configured to be cut based on a result of comparing a number of bits of a defective input address having a first logic level with a number of bits of the defective input address having a second logic level, and wherein the address fuse circuit is configured to generate a first address using the first fuses based on a cutting operation that depends on the result of comparing; and a first circuit configured to output either the first address or a second address that is an inverted address of the first address as a repair address, wherein a logic level of each of the bits of the repair address is the same as that of the defective input address.

2. The redundancy control circuit of claim 1, wherein the address fuse circuit is further configured to:

cut fuses corresponding to bits having the first logic level when a majority of bits in the defective input address have the second logic level, or cut fuses corresponding to bits having the second logic level when a majority of bits in the defective input address have the first logic level.

3. The redundancy control circuit of claim 2, further comprising:

a master fuse circuit configured to determine whether to output the first address or the second address as the repair address corresponding to the defective input address.

4. The redundancy control circuit of claim 3, wherein the master fuse circuit is configured to generate a first master fuse signal for outputting the first address and a second master fuse signal for outputting the second address.

5. The redundancy control circuit of claim 4, wherein the first and second master fuse signals and the first address are generated by using a power-up signal.

6. The redundancy control circuit of claim 4, wherein the first circuit includes:

a first transmission gate configured to output the first address as the repair address based on the first master fuse signal;

an inverter configured to invert the first address to provide the second address; and a second transmission gate configured to output the second address as the repair address based on the second master fuse signal.

7. The redundancy control circuit of claim 3, wherein the master fuse circuit includes a plurality of second fuses that store information about whether a normal cutting operation or a reverse cutting operation has been performed, the master fuse circuit being configured to detect program states of the second fuses to generate the first and second master fuse signals.

8. The redundancy control circuit of claim 1, further comprising:

a redundancy control signal generating unit that includes:
an address comparison block configured to compare the repair address with the defective input address; and
a redundancy enable signal generating circuit configured to perform logical operations based on the comparison result to generate a redundancy enable signal.

9. A semiconductor memory device comprising:
the redundancy control circuit of claim 8;
a first memory cell;
a second memory cell configured to replace the first memory cell when the first memory cell is defective; and
an address decoder configured to perform a decoding operation based on an input address and the redundancy enable signal to select the first memory cell or the second memory cell.

10. A redundancy control circuit comprising:
an address fuse circuit including a plurality of first fuses,
wherein each of the first fuses is configured to be cut based a result of comparing a number of bits of a defective input address having a logic level of 0 with a number of bits of the defective input address having a logic level of 1, and
wherein the address fuse circuit is configured to generate a first address using the first fuses based on a normal cutting operation when the number of bits of the defective input address having a logic level of 0 is greater than the number of bits of the defective input address having a logic level of 1, or to generate a second address using the first fuses based on a reverse cutting operation when the number of bits of the defective input address having a logic level of 1 is greater than the number of bits of the defective input address having a logic level of 0; and a first circuit configured to output either the first address or the second address as a repair address, wherein a logic level of each of bits of the repair address is the same as that of the defective input address.

11. The redundancy control circuit of claim 10, wherein the normal cutting operation includes cutting fuses so that the output from the first fuses has the same logic level as the defective input address, and the reverse cutting operation includes cutting fuses so that the output from the first fuses has opposite logic levels from the defective input address.

12. The redundancy control circuit of claim 10, further comprising:

a master fuse circuit configured to determine whether to output the first address or the second address as the repair address corresponding to the defective input address.

13. The redundancy control circuit of claim 12, wherein the master fuse circuit is configured to generate a first master fuse signal for outputting the first address and a second master fuse signal for outputting the second address.

14. The redundancy control circuit of claim 13, wherein the first and second master fuse signals and the first address are generated by using a power-up signal.

15. The redundancy control circuit of claim 13, wherein the master fuse circuit includes a plurality of second fuses that store information about whether the normal cutting operation or the reverse cutting operation has been performed, the master fuse circuit being configured to detect program states of the second fuses to generate the first and second master fuse signals.

16. The redundancy control circuit of claim 10, further comprising:

a redundancy control signal generating unit that includes:
an address comparison block configured to compare the repair address with the defective input address; and
a redundancy enable signal generating circuit configured to perform logical operations based on the comparison result to generate a redundancy enable signal.

17. A semiconductor memory device comprising:
the redundancy control circuit of claim 16;
a first memory cell;
a second memory cell being configured to replace the first memory cell when the first memory cell is defective; and
an address decoder configured to perform a decoding operation based on an input address and the redundancy enable signal to select the first memory cell or the second memory cell.

18. A method manufacturing a semiconductor device, the method comprising:

determining one or more defective memory cells of the semiconductor device including a first memory cell having a particular address;

for the particular address, cutting a plurality of first fuses in a fuse unit, to create a first address that corresponds to the particular address, wherein cutting the plurality of first fuses includes determining to cut one or more of the first fuses corresponding to bits having a first logic level when a majority of bits in the particular address have a second logic level, or determining to cut one or more of the first fuses corresponding to bits having the second logic level when a majority of bits in the particular address have the first logic level;

configuring the semiconductor device to determine whether to output the first address or a second address that is an inverted address of the first address as a repair address; and configuring the semiconductor device to generate the repair address, wherein a logic level of each of bits of the repair address is the same as that of the defective input address.

19. The method of claim 18, wherein the first logic level is 0 and second logic level is 1.

20. The method of claim 18, wherein the step of configuring the semiconductor device to determine whether to output the first address or a second address includes cutting additional fuses that select whether to output the first address or the second address.

* * * * *